(12) United States Patent
Yamada et al.

(10) Patent No.: US 6,434,008 B1
(45) Date of Patent: Aug. 13, 2002

(54) SEMICONDUCTOR DEVICE

(75) Inventors: Kazuji Yamada; Akira Tanaka; Ryuichi Saito, all of Hitachi; Yasutoshi Kurihara, Hitachinaka; Tadao Kushima; Takashi Haramaki, both of Tokai-mura; Yoshihiko Koike, Hitachi; Takashi Hosokawa, Kodaira; Mamoru Sawahata, Hitachi; Masahiro Koizumi, Hitachi; Jin Onuki, Hitachi; Kazuhiro Suzuki, Mito; Isao Kobayashi, Naka-machi; Hideo Shimizu, Hitachi; Yutaka Higashimura, Hitachi; Shigeki Sekine, Hitachi; Nobuya Koike, Takasaki; Hideya Kokubun, Takahagi, all of (JP)

(73) Assignees: Hitachi, Ltd., Tokyo; Hitachi Haramachi Electronics Co., Ltd., Hitachi, both of (JP)

( * ) Notice: Subject to any disclaimer, the term of this patent is extended or adjusted under 35 U.S.C. 154(b) by 0 days.

(21) Appl. No.: 09/385,632

(22) Filed: Aug. 27, 1998

Related U.S. Application Data

(63) Continuation of application No. 08/539,075, filed on Oct. 4, 1995.

(30) Foreign Application Priority Data

| Oct. 7, 1994 | (JP) | ............................................ 6-243654 |
| Dec. 28, 1994 | (JP) | ............................................ 6-326633 |
| Dec. 28, 1994 | (JP) | ............................................ 6-326640 |
| Jan. 11, 1995 | (JP) | ................................................. 7-2818 |

(51) Int. Cl.[7] .............................................. H05K 7/02
(52) U.S. Cl. ...................... 361/728; 361/807; 361/820; 174/255; 174/258; 174/262; 257/678; 257/690; 257/692
(58) Field of Search ................................ 361/728, 807, 361/820, 746; 174/52.1, 255, 258, 262; 257/678, 687, 690, 692, 693

(56) References Cited

U.S. PATENT DOCUMENTS

| 5,155,660 | A | * | 10/1992 | Yamada et al. .............. 361/728 |
| 5,202,578 | A | * | 4/1993 | Hideshima ................... 257/685 |
| 5,424,579 | A | * | 6/1995 | Arai et al. .................... 257/690 |
| 5,444,295 | A | * | 8/1995 | Lake et al. ................... 257/678 |
| 5,471,089 | A | * | 11/1995 | Nagatomo et al. .......... 257/691 |
| 5,519,252 | A | * | 5/1996 | Soyano et al. .............. 257/690 |
| 5,521,437 | A | * | 5/1996 | Oshima et al. ............. 257/701 |
| 5,559,374 | A | * | 9/1996 | Ohta et al. ................... 257/723 |
| 5,661,343 | A | * | 8/1997 | Takahashi et al. .......... 257/723 |
| 5,956,231 | A | * | 9/1999 | Yamada et al. ............. 361/728 |

* cited by examiner

*Primary Examiner*—Darren Schuberg
*Assistant Examiner*—David Foster
(74) *Attorney, Agent, or Firm*—Antonelli, Terry, Stout & Kraus, LLP

(57) ABSTRACT

A semiconductor device in which a plurality of semiconductor elements are bonded onto at least one electrode pattern on an insulator substrate formed a plurality of electrode patterns on the main surface, each of the electrodes of the semiconductor element being electrically connected to the electrode pattern, the other surface of the insulator substrate being bonded to a heat dissipating base, the upper surface of the heat dissipating base being covered with a member for cutting off the semiconductor elements from the outer environment, terminals electrically connecting the electrodes on said insulator substrate and the electrode placed outside the cutoff member being provided, wherein the material of the heat dissipating base has a linear expanding coefficient larger than the linear expansion coefficient of the semiconductor element and smaller than three times of the linear expansion coefficient of the semiconductor element, and a thermal conductivity larger than 100 W/mK, the semiconductor elements being arranged on at least one electrode surface and in at least two regions divided by the other electrode surface on the insulator substrate.

11 Claims, 25 Drawing Sheets

RELATIVE DISTANCE L BETWEEN RIGHT HAND SIDE END OF TERMINAL AND END OF ELECTRODE PATTERN TO THICKNESS OF (TERMINAL + ELECTRODE)

FIG. 17

| | MATERIAL | DIELECTRIC CONSTANT |
|---|---|---|
| AIR LAYER (VOID) | AIR | 1.0 |
| INSULATOR | AlN | 8.9 |
| | Al$_2$O$_3$ | 8.5 |
| RESIN | SILICONE GEL | 2.7 |
| | SILICONE RUBBER | 2.8 |
| | THERMOSETTING ADHESIVE | 3.1 |
| SILICONE OIL | | 2.6 |

SEMICONDUCTOR DEVICE

CROSS-REFERENCE TO RELATED APPLICATION

This application is a divisional of application Ser. No. 08/539,075, filed Oct. 4, 1995, the entire disclosure of which is hereby incorporated by reference.

BACKGROUND OF THE INVENTION

1. Field of the Invention

The present invention relates to a semiconductor module and a semiconductor device using a power semiconductor element, and more particularly relates to a semiconductor device for inverter and converter.

2. Description of the Related Art

In various kind of motor control, GTOs (Gate Turn Off Thyristors) have been used in the field of large power and transistors have been used in the field of small power. However, in recent years IGBTs (Insulated Gate Bipolar Transistors) are rapidly spreading in the field of GTO and transistor because of ease of use that large current can be controlled by voltage signal. IGBTs are generally used in the form of module. Today, there are various types. For instance, in three-phase motor control, three phase and upper-arm/lower-arm currents need to be switched. That is, three switches for upper arms, three switches for lower arms, total of six switches are required. Therefore, there are a type where IGBTs corresponding to one arm are mounted on a module, a type where IGBTs corresponding to six arms are mounted on a module, and a type where an additional circuit is further mounted.

As for structures, although there are proposed various ideas, an example close to the present invention, in which IGBTs corresponding to one arm are mounted on a module, will be explained below.

Since plural chips of IGBT are used in connecting in parallel when a single chip cannot control a desired capacity of current, a semiconductor switching device mounting plural chips connected in parallel will be discussed.

A structure will be described below, according to a common manufacturing process. One surface of an IGBT chip is bonded on one of Cu thin plates, which are bonded on both surfaces of an alumina or AlN ceramic substrate, using a solder having a highest melting point among solders to be used in the module. This Cu plate commonly becomes a collector terminal. On the other surface of the chip, an emitter and a gate electrodes are formed. Both are wire-bonded to an emitter and a gate terminal Cu thin plates formed on the same surface of the ceramic substrate as the collector terminal are formed, respectively. The Cu plate on the other surface of the ceramic substrate is bonded to a cooling plate as a base of the module using solder. An Al or Cu plate is commonly used for the cooling plate. Connection of the module external terminals to the electrodes on the ceramic substrate is performed by Cu leads integrally formed together with the external terminals. The external terminal is usually called as a terminal block. A molded resin case is bonded to the metallic base (cooling plate) using an adhesive. A gel is injected through an aperture intentionally opened between the case and the terminal block and hardened, and then above it a hard resin is injected and hardened. It is basically preferable to harden the gel after sufficiently removing bubbles from the injected gel. However, if removing of bubbles is performed in this structure, the gel rises up along the inner surface of the case to cause degradation of bonding between the hard resin and the case. Therefore, the hard resin is injected without the important removal of bubbles.

The above is a common manufacturing process and a common structure of a module.

The module is attached to a proper cooling structure with bolts using holes formed on the four corners of the metallic base. Since the electric potential of the cooling structure is generally in ground potential, insulation to the IGBT chip is performed by the ceramic substrate.

The external terminals are composed of a collector terminal, an emitter terminal, a gate terminal and an emitter auxiliary terminal for gate.

In the aforementioned conventional technology, there are problems as follows.

(1) life-time of bonding solder between the metallic base and the ceramic substrate: When a module is started to operate, heat is generated and shear stress is generated in the bonding solder due to difference of linear expansion coefficients between the metallic base and the ceramic substrate. The solder is thermal-fatigued and then cracks progress inside the solder generally from the periphery to the metallic base. When the cracks are progressed to a certain degree and the thermal resistance between the IGBT chip and the metallic base is increased, the solder cracks are acceleratively progressed due to applying of positive thermal feed-back on the solder cracks and finally the module becomes incapable of operating.

(2) The gel plays a role of passivation by coating over the IGBT chip. When the hard resin allowed to flow over the gel is hardened, the chip is usually heated at nearly 150° C. At this time, the volume of the gel is expanded by approximately 10%. In the process of cooling after completion of hardening, cracks are generated inside the gel because the contraction of the gel volume is restricted by the case and the hard resin. This phenomenon can be confirmed by observing an actual product with X-ray. If the cracks reach over the IGBT chip, the passivation effect for the chip disappears.

(3) In a case of using modules connected in parallel, the gate-emitter circuit in the input circuit forms a loop. There are some cases where an oscillation phenomenon occurs due to inductance and floating capacitance between the gates and between the emitters and input capacitance.

(4) The external terminals are generally arranged in the lateral direction of the module in order of collector terminal, emitter terminal, gate terminal and gate/emitter auxiliary terminal by structural reason. In this arrangement, however, the external wiring becomes complex and error operation probably occurs due to mutual noises when a lot of modules are mounted as an inverter. Specially in a case where the modules are applied to an inverter for vehicle, the mounting space in vertical direction should be decreased as low as possible since the inverter is installed under the floor. Therefore, the modules are preferably mounted in arranging the shorter side direction of the modules to the vertical direction. In this case, the wiring becomes complex when the conventional arrangement of the terminals is employed.

(5) In order to switching the modules at a high speed, inductances of the collector and the emitter should be decreased as small as possible.

Although the above description regarding modules is problems on a power switching device, that is basically common problems on a current control device using semiconductors.

In the conventional technology, an insulator capacitance component is generated at the portion where withdrawal or void is generated inside the solder bonding the metallic film and the insulator substrate, or at the portion where a gap is provided between the metallic film and the insulator substrate. This insulator capacitance component is connected to an insulator capacitance component due to the insulator substrate in series. When a high voltage is applied to the module is this case, a partial discharge (corona discharge) occurs in the vacant layer where the insulator capacitance component occurs. Since the partial discharge during operation of the module deteriorates the filling agent inside the module such as silicon gel, deterioration of insulation is caused at last. The partial discharge during switching causes noise, the noise causes error operation specially in a module of insulated gate type element such as IGBT.

However, when number of semiconductor elements in a module, it is difficult to make the amount of current flowing each of the elements uniform due to variation of characteristic of each elements and difference in wiring length in side the module. When the non-uniformity in current occurs among the elements, spike noise occurs due to shift in ON/OFF time among the elements during switching operation. There arises a problem in that solder or the metallic wire of one element where current is concentrated is deteriorated in a short time comparing the other elements.

SUMMARY OF THE INVENTION

An object of the present invention is to solve the aforementioned problems in the conventional technology.

(1) Means to solve the problem (1) above is not only to suppress the amount of heat generation of the IGBT chip (the same can be said for a bipolar transistor and an MOS transistor), but also to select a ceramic substrate mounting the chip and a metallic base which have linear expansion coefficients close to each other and to employ the metallic base material having a high thermal conductivity. Since the chip and the ceramic substrate are bonded with solder, the result is that it is important to match the linear expansion coefficients of the chip, the ceramic substrate and the metallic base with one another. Since the thermal coefficient of the chip is approximately $3.5 \times 10^{-6}/°$ C., it is suggested that Mo is used for the metallic base. However, the inventors have found that simply using Mo instead of Cu, which is conventionally used, leads three large problems.

The first problem is that a crack occurs in the ceramic at a position under a Cu thin plate on the ceramic substrate where an electrode terminal is bonded by solder. Since the linear expansion coefficients of the ceramic substrate and the Mo plate are close to each other, the thermal stress acting on the solder between the ceramic substrate and the Mo plate is decreased. That is, the ceramic substrate and the Mo plate are thermally deformed as if the both are formed of one material. Therefore, the thermal stress between the Cu thin plate on the ceramic substrate and the ceramic substrate is increased. It has been estimated from a result of thermal stress analysis that when a Cu terminal is attached onto the Cu thin plate, the thermal stress under the terminal is extremely increased much more to cause cracks in the ceramic under the Cu thin plate. Therefore, it is necessary to prevent the ceramic substrate from damage by suppressing the thermal deformation of the Cu thin plate and decreasing the thermal stress between the Cu thin plate and the ceramic substrate in such a structure that the Cu thin plate portion to be attached with the Cu terminal is not bonded to the ceramic substrate, that is, in a floating state, or that the portion to be attached with the Cu terminal is not placed in the periphery of the Cu thin plate pattern, but is placed in the inner side of the Cu thin plate pattern, or that a material having a small linear expansion coefficient such as Mo is inserted between the Cu terminal and the Cu thin plate.

The second problem is that loosening of fixing bolt or damage of fixing bolt occurs by thermal deformation due to the difference in linear expansion coefficients the metallic base of a semiconductor device and the member to fix the semiconductor device. In order to solve the problem, the thermal deformation described above is absorbed by deformation of a bolt in such a structure that the length of the bolt is lengthened by inserting a ring having a linear expansion coefficient close to that of the bolt between the head of the bolt and the metallic base.

The third problem is that there is no material of which linear expansion coefficient is close to that of silicon and thermal conductivity is as large as that of Cu. Mo does not satisfy this condition. For instance, the thermal conductivity of Cu is approximately 390 W/mK. On the other hand, the thermal conductivity of Mo is approximately 140 W/mK which is about ⅓ of that of Cu. As far as considering the thermal resistance from the chip to the metallic base, this difference does not become a problem, but grease is usually inserted between external cooling members to attach a semiconductor device in order to absorb bending of the external cooling members. However, since the thermal conductivity of grease is as low as 1 W/mK, in order to compensate the thermal resistance of the grease layer it is necessary to diffuse heat generated inside the semiconductor device over the whole area of the metallic base and then dissipate the heat from the large area through the grease layer. When Mo is used for the metallic base, the heat transferred from the chip is not sufficiently diffused and accordingly the heat has to be dissipated from a small area of the metallic base. This increases the thermal resistance. In order to avoid this phenomenon, it is necessary to arrange the heat sources of the chips as sparse as possible.

(2) In order to prevent the crack in the gel described above in the item of problem (2), it is necessary that the interface between the gel and the hard resin injected on the gel is separated when the hard resin is hardened. Although it is preferable that the surface of the gel is coated with a mold release agent, there is no proper material in the state of the art.

With this being the situation, a space is provided above the upper surface of the gel so that the gel can freely expand and contract. In this case, it is a key point to maintain the hermeticity of the space. The following structures are invented.

(i) The gap between the terminal and the mold in a terminal block is coated with a high viscous resin or a hard resin to be described (ii) below.

(ii) The case and the block are engaged with a J-shaped structure, and this portion is sealed using a hard resin.

Even if the above countermeasure for hermeticity is performed, countermeasure for condensation on the surface of the gel is required since the case and so on are made of organic materials. Thereby, the following method is invented. The terminal passes through the inside of the gel and the space. When condensation occurs on the surface of the gel, the withstanding voltage of insulation between the electrodes is degraded on the surface of the gel. Therefore, the electrode in the space is covered with the molding material for the terminal block so that the lowermost covered portion is dipped into the gel. That is, the invented structure is that the electrode inside the module is not exposed to the space.

(3) In order to suppress the oscillation phenomenon apt to occur in the parallel connection of the semiconductor device described above in the item of the problem (3), it is effective to insert an external resistor in the gate circuit. In this case, it is necessary to suppress the external noise added to the gate circuit as low as possible. The invented terminal arrangement to suppress the noise due to electromagnetic induction is that an auxiliary gate terminal is provided in the terminal block of the semiconductor switching device to decrease the area formed by the gate circuit and the wire of the auxiliary emitter circuit.

(4) As described above in the item of the problem (4), the invented structure is that the collector and the emitter terminals are arranged in the direction of the shorter side of the module in order to decrease mounting area and simplify the wiring as an inverter.

(5) As described above in order to suppress the inductance of the electrode terminal as small as possible, the following structures are invented.

(i) In order to suppress the inductance of the electrode terminal small, the mechanical length of the terminal is made as short as possible. The invented structure is that the collector and the emitter terminals are crossed with each other with spacing in the vertical direction for keeping insulation inside the gel to shorten the length of the terminals.

(ii) As an alternative method, there is a method to decrease the effective inductance utilizing the mutual inductance by considering the current flow directions of the collector and the emitter terminals. The invented structure is that in order to suppress the inductance of the electrode terminals small, the vertical wide width portions of the collector and the emitter terminals are arranged in parallel to each other since the current flows in the vertical position of the collector and the emitter terminals are opposite to each other.

The circuit board according to the present invention comprises a means for short-circuiting an insulator capacitance component which is generated at the portion where withdrawal or void is generated inside the solder bonding the metallic film and the insulator substrate, or at the portion where a gap is provided between the metallic film and the insulator substrate.

In more detail, a first conductor layer is provided on one of the surfaces of the insulator plate, and a second conductor layer is provided in a position facing to the first conductor layer on the insulator plate, consequently, the second conductor layer is provided in separating from the first conductor. Further, the first conductor layer and the second conductor layer are electrically connected by a conductor.

In the semiconductor device according to the present invention, semiconductor elements are jointed to the first conductor layer on the circuit board described above, and at the same time an insulator capacitance component is short-circuited by bonding a conductive base to the other surface of the insulator substrate, that is, to the surface in the opposite side of the first conductor layer.

The object of suppressing the partial discharge described above can be attained by filling a dielectric material in a gap between an insulator plate of a circuit board and a conductor layer in a circuit board such as DBC (Direct Bond Copper) board or a semiconductor device having such a board.

In more detail, the circuit board according to the present invention comprises an insulator plate, a conductor layer placed on the surface of the insulator plate, a dielectric layer provided in a gap portion between the insulator plate and the conductor layer. Therein, the following relationship exists among the dielectric constant of the dielectric layer $\in_g$, the dielectric constant of the insulator plate $\in_b$, the thickness of the gap portion $L_g$, and the thickness of the insulator plate $L_b$.

$$\in_g \geq \in_b \times (L_g/L_b) \quad \text{(Equation 1)}$$

There, $\in_g$ and $\in_b$ are in the same unit, and $L_g$ and $L_b$ are also in the same unit.

In the semiconductor device according to the present invention, semiconductor elements are jointed to the conductor layer on the circuit board having the structure described above, and at the same time the circuit board is jointed to a conductive support base. Further, in the semiconductor device according to the present invention, a fluid dielectric material is filled in the device so as to adjoin to the insulator plate and the conductor layer of the circuit board contained.

The semiconductor module to attain the object described above comprises a substrate made of an insulator, a plurality of semiconductor elements arranged on the insulator substrate, external connecting terminals electrically connected to an external apparatus, a conductor pattern formed on the insulator substrate, jointed with the external connecting terminals as well as electrically connected with the electrodes of the plurality of semiconductor elements in parallel to form a current path from the external connecting terminals to the plurality of semiconductor elements, wherein the conductor pattern is formed symmetrically in regard to a certain phantom line on the insulator substrate, a plurality of positions on the phantom line and symmetrical in regard to the phantom line being used as jointing zones for the external connecting terminal, current bypass portions to make the individual current paths of the plurality of semiconductor elements in a nearly equal length being provided, the current bypass portion is formed by cutting away a path between a semiconductor element and the jointing zone and providing a bypass for allowing current to flow between the semiconductor element and the jointing zone when the distance between the electrode of the semiconductor element and the jointing zone is shorter than the distances between the electrodes of the other semiconductor elements and the jointing zones. In a case where the semiconductor element has plural electrodes or an expanded electrode, the averaged distance is taken as the distance between the electrode of the semiconductor element and the jointing zone.

Further, the semiconductor module to attain the object described above comprises a substrate made of an insulator, a plurality of semiconductor elements arranged on said insulator substrate, external connecting terminals electrically connected to an external apparatus, a conductor pattern formed on the insulator substrate, jointed with the external connecting terminals as well as electrically connected with the electrodes of the plurality of semiconductor elements in parallel to form a current path from the external connecting terminals to the plurality of semiconductor elements, wherein the external connecting terminal comprises a facing portion on the conductor pattern, the facing portion being parallel to and facing to the zone of each of the current paths for each of the semiconductor elements, the direction of current flow in the facing portion being opposite to the direction of current flow in each of the current paths.

By forming a conductor pattern symmetrical in regard to a specified phantom line as the center line and symmetrically arranging a plurality of semiconductor elements, the current path length concerning a semiconductor element on the right hand side and the current path length in relation to a semiconductor element on the left hand side become equal to each other, the inductances of the both current paths also become equal, and consequently the same current can flow both in the element on the right hand side and in the element on the left hand side. However, even if plural semiconductor elements are symmetrically arranged, for example, in a case of three semiconductor elements, the current flowing in a semiconductor placed in the center is different from the current flowing in the other semiconductor element. In more detail, in a case where number of semiconductor elements is three and the junction zone for the external connecting terminals are placed on the phantom line for symmetrical standard, the current path length concerning the semiconductor element in the center is shorter than the current path length in relation to the other semiconductor elements, the inductance of the current path in relation to the semiconductor element placed in the center is also smaller than the inductances of the current path in relation to the other semiconductor elements, and consequently current flows much in the element placed in the center.

In the present invention, a plurality of semiconductor elements are symmetrically arranged, and current bypass portions to make the individual current paths of the plurality of semiconductor elements in a nearly equal length being provided. The current bypass portion is formed by cutting away a path between a semiconductor element and the jointing zone and providing a bypass for allowing current to flow between the semiconductor element and the jointing zone when the distance between the electrode of the semiconductor element and the jointing zone is shorter than the distances between the electrodes of the other semiconductor elements and the jointing zones. As the result, the inductance of a current path in relation to a semiconductor element in which much current flows is increased and becomes equal to the inductance of the current paths in relation to the other semiconductor elements. The same quantity of current flows in each of all the semiconductor elements. In more detail, in a case of three semiconductors, a current bypass portion is formed by cutting away the conductor pattern between a semiconductor element and the jointing zone for the external connecting terminal and providing a bypass for allowing current to flow between the semiconductor element placed in the center and the jointing zone. By lengthening the current path in relation to the semiconductor element placed in the center, the length of current path becomes equal to the length of the current path in relation to the other semiconductor elements. By doing so, the same quantity of current flows in each of all the semiconductor elements.

When current flows in a pair of parallel wires in the opposite directions to each other, each of the inductance of the wire is mutually canceled. Therefore, in a case where a facing portion in facing to the conductor pattern is formed in the external connecting terminal, the inductance in the region of each of the current paths for plural semiconductor elements and the inductance in the facing portion of the external connecting terminal are mutually canceled. In this reason, even if there are differences among the lengths of current paths in the conductor pattern for the plural semiconductor elements, there is almost no difference among the inductances of the current paths and consequently the same quantity of current can be conducted in each of the semiconductor elements.

A semiconductor device, especially, a semiconductor large current switching device is subjected to large temperature difference and large number heat cycles. Therefore, the most important problem is to keep the life time against fatigue of solder bonding between the members used. The fundamental measure is to decrease the strain occurred in the solder to extend the life time against thermal fatigue by closing the linear expansion coefficients of the members used. With this measure, the three main problem described above must be overcome at a time. The long life time can be attained by performing the following three measures at a time, that is, (1) measure for crack produced in the ceramic substrate under a terminal, (2) dispersion of heat sources, (3) measure to decrease deformation of the fixing bolt. However, whether all the measures are required at a time or not is determined by the reliability required for a product. As for the resolution of the item (1), by separating the Cu thin plate under a terminal from the ceramic substrate, that is, in the state of so-called counter-beam, the Cu thin plate easily deforms so that stress does not occur between the ceramic substrate and the Cu thin plate. Another method is that the terminal is not bonded at the end portion of the Cu thin plate pattern, but at a position inside from the end portion by the distance of twice of the sum of the thickness of the terminal and the thickness of the Cu thin plate. By doing so, the problem to decrease the stress in the end portion of the Cu thin plate pattern can be solved. As a further method, a metal having a linear expansion coefficient close to that of the ceramic substrate is inserted between the terminal and the Cu thin plate. By sandwiching the Cu thin plate, the Cu thin plate burdens most part of the thermal deformation to decrease the thermal stress on the surface of the ceramic substrate under the terminal. As for the item (2), it is necessary to disperse chips generating heat at the same time by making the Cu thin plate patter on the ceramic substrate proper without degrade the electrical characteristics. As for the item (3), the key point is to decrease the stress produced in the bolt. A collar made of a material having a linear expansion coefficient nearly equal to the linear expansion coefficient of the fixing bolt is inserted between the head of bolt and the metallic base. By lengthening the length of the bolt and thermally deforming the collar, the stress produced in the bolt is decreased.

In the conventional technology, the gel crack measure is a large problem. When crack reach to the surface of a chip, the passivation effect by gel disappears. Since the main cause to produce cracks is in the structure to impede the contraction of gel, the fundamental measure is to provide a space over the gel. This method has a bad reaction. It is necessary to keep the hermeticity of the space and to keep the insulation between the terminals. It is necessary to suppress raising-up phenomenon of gel along the case wall at injecting and hardening the gel which impedes the wetness of the hard resin between the terminal and the case. The measure against this phenomenon is that the injection and hardening of the gel is performed after the injection and hardening of the hard resin. The insulation between the terminals is kept by covering the portions of the terminals exposed in the space with a molding material. By doing so, it is also possible to reduce the weight of the device.

In the circuit board according to the present invention, even if an insulating capacitance component is generated between the first conductor layer and the insulator substrate by occurrence of withdrawal or void of the solder or by providing a gap, the insulating capacitance component is short-circuited by the second conductor layer and the conductor. Therefore, since voltage is not applied to the insulating capacitance component, the partial discharge can be prevented.

Further, in the semiconductor device according to the present invention having such a circuit board, deterioration of the filler due to partial discharge and error operation of semiconductor element can be prevented. Thus, the reliability of the semiconductor device can be improved.

In the circuit board, the insulating capacitance component $(C_b)$ by the portion of the insulator plate contacting to the gap and the insulating capacitance component $(C_g)$ by the gap are connected in series. Therefore, when voltage $(V_l)$ is applied to the circuit board of a semiconductor device mounting the circuit board, the voltage is split into each of the insulating capacitance components. Therein, according to the present invention, since a dielectric material is filled in the gap and the insulating capacitance component of this portion is, therefore, increased, the voltage ($V_g$) split in the gap can be decreased ($V_g=V_I \times C_b/(C_g+C_b)$). Accordingly, the partial discharge in the gap can be suppressed.

Where $C_b$ is proportional to $\in_b/L_b$, and $C_g$ is proportional to $\in_g/L_g$. Therefore, when the relation expressed by the equation 1 is satisfied, $C_g$ can be larger than $C_g$. Thus the partial discharge in the gap can be certainly suppressed by decreasing $V_g$ smaller than the voltage split in the insulator plate.

Further, by filling the semiconductor device with a fluid dielectric material, the dielectric material flows into a gap in a circuit board caused by separation of a conductor layer or crack of the insulator plate. Thus the partial discharge in the gap can be suppressed.

BRIEF DESCRIPTION OF THE DRAWINGS

FIG. 17 is a table showing the dielectric constants of various insulating materials.

DETAILED DESCRIPTION OF THE PREFERRED EMBODIMENTS

Figure 1A:
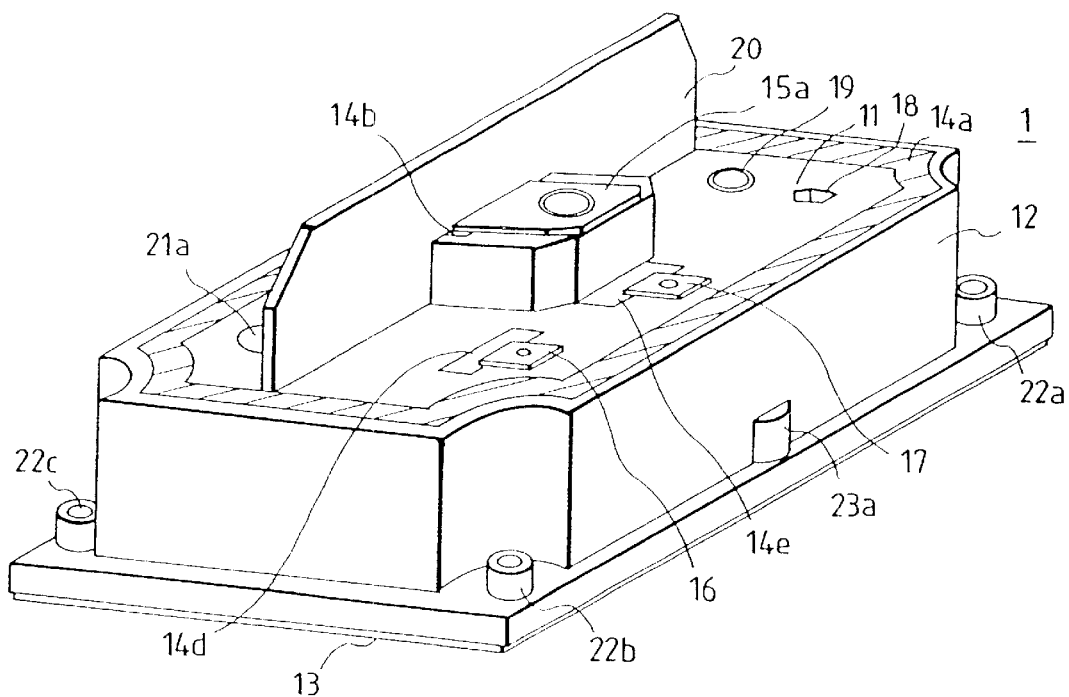
FIGS. 1(a) and 1(b) are external views of a semiconductor device in accordance with the present invention, where 1(a) is a perspective view and 1(b) is a plan view.

An embodiment of the present invention will be described below, referring to FIGS. 1(a) and (b). FIG. 1(a) is a perspective view showing a semiconductor device in accordance with the present invention and (b) is its plan view. The reference character 11 is a terminal block. The terminal block comprises an emitter terminal 15a which is a main electrode terminal, a collector terminal 15b, an insulator plate 20 to obtain insulating withstanding voltage between the both electrodes, a gate terminal 17, gate auxiliary terminals 18, 19, (the gate auxiliary terminals 18, 19 are usually short-circuited and a oscillation preventing gate resistor is connected between the gate auxiliary terminal 19 and the gate terminal 17), and rubber caps 21a, 21b to keep the hermeticity of a space under the terminal block. The reference character 12 is a case which is fixed with the terminal block using a hard resin 14a. The reference characters 14b, 14c, 14d, 14e are hard resin foe keeping hermeticity between the electrodes and the terminal block. The reference character 13 is a metallic base. The reference characters 23a, 23b are embedded nuts embedded in the case. The metallic base 13 and the case 12 are fixed to each other with an adhesive (not shown) and the embedded nut 23a, 23b using screws. The reference characters 22a, 22b, 22c, 22d are collars for extending the length of bolts attached to holes for fixing the semiconductor device to an external heat dissipating plate. Mo is used for the metallic base 13. However, since even the thermal conductivity of Mo is not sufficient, other materials such as Al/SiC composite material, Cu/SiC composite material, Cu/BN composite material may be used. The physical properties which the metallic base should have is determined by the condition of reliability of an object to which the current control device is used. There is no clear condition, such as acceptable condition of linear expansion coefficient being lager than a certain value or unacceptable condition of linear expansion coefficient being smaller than a certain value. As for a semiconductor device for vehicle, the load condition is sever and the required life time of the product is more than 20 years. According to an experimental result, it is preferable that the linear expansion coefficient is smaller than one-half of that of Cu, that is, $6 \times 10^{-6}/°$ C. and larger than that of Si, that is, $3.5 \times 10^{-6}/°$ C.; the thermal conductivity is larger than one fourth of that of Cu, that is, 100 W/mK.

The gate external resistor is connected between the gate auxiliary terminal 19 and the gate terminal 17. An external gate circuit is connected to the gate auxiliary terminal 18. In a case where a semiconductor device is used as a one unit, the external gate circuit is directly connected to the gate terminal 17. Since the gate auxiliary terminals 18 and 19 are placed on the terminal block, both of the electrode terminals can be closely arranged.

Figure 2A:
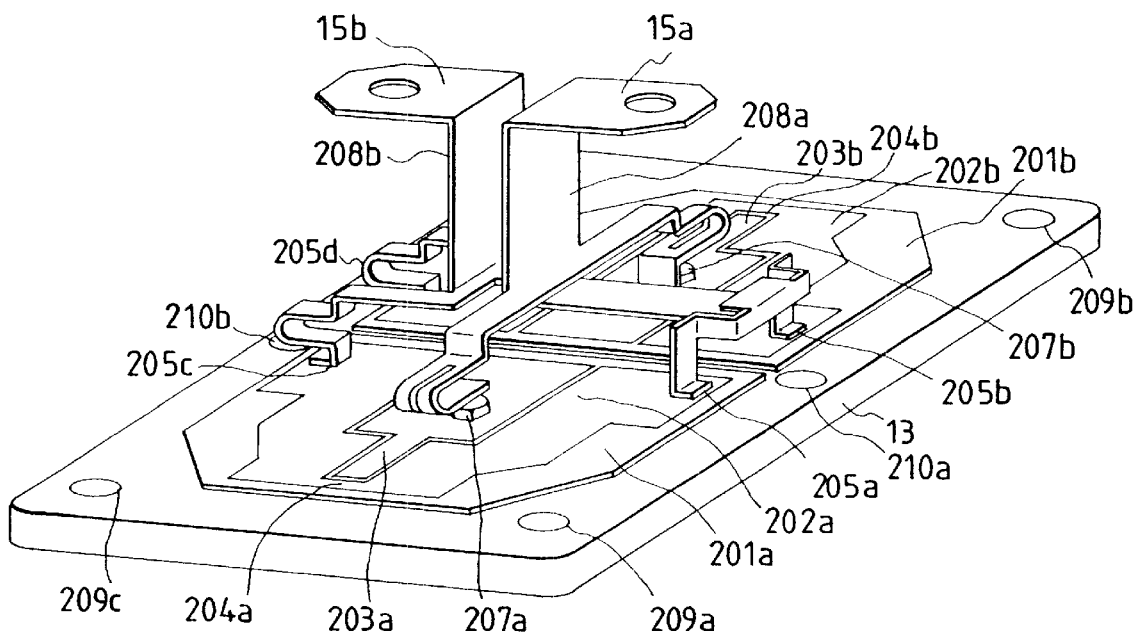
FIG. 2(a) is a view showing the internal structure of a semiconductor device in accordance with the present invention, and 2(b) is a view showing the details of the terminals.
Figure 2B:
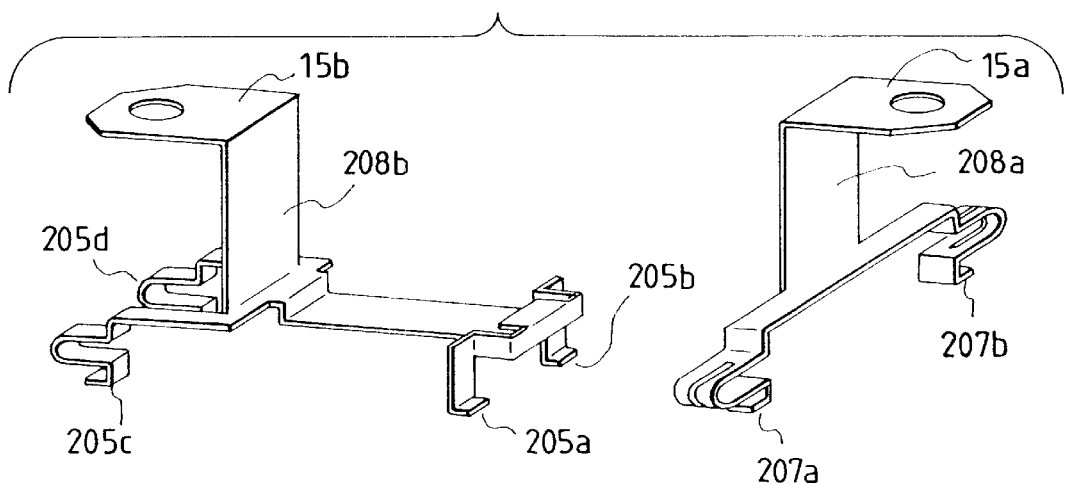

An internal structure will be described mainly on the terminal of a semiconductor device according to the present invention in detail, referring to FIG. 2(a) and FIG. 2(b). The reference character 201a 201b are AlN ceramic substrates. Cu thin plates are bonded onto almost the whole surfaces of the AlN ceramic substrates 201a, 201b in the side of the metallic base 13 directly or using a solder added with activation metal such as Ti. The metallic base 13 and the Cu thin plates on the AlN ceramic substrates 201a, 201b are bonded using a eutectic solder. The other side surfaces of the AlN ceramic substrates 201a, 201b are also bonded with Cu thin plate as the same as described above. However, the Cu thin plate on these surfaces are patterned in the collector zones 202a, 202b, the emitter zones 203a, 203b, and the gate zones (not shown). An IGBT chip (not shown) is connected onto a proper position of the collector pattern using solder. The collector pattern is divided into two zones on the substrate, and the two zones are connected with a thin Cu thin plate 204a or 204b. The collector terminal 15b is connected with connecting portions 205a, 205c, and 205b, 205d to the Cu thin plate pattern 202a, 202b using a eutectic solder. The emitter pattern 203a, 203b and the emitter terminal 15a are connected at emitter terminal connecting positions 207a, 207b to the Cu thin plate pattern 203a, 203b using a eutectic solder. The collector electrode terminal 15b passes through under and crosses with the emitter terminal so that its length becomes short. The rising portions 208a, 208b of the collector and the emitter terminals are arranged in side by side.

In this embodiment, AlN is used for the ceramic substrate. The reason to use AlN is that the linear expansion coefficient of AlN is $5.7 \times 10^{-6}/°$ C. and close to that of Si, and the thermal conductivity is larger than 100 W/mK. However, since the thickness of the substrate is generally as thin as 0.6 mm, the thermal resistance does not become so large even if alumina is used. Therefore, alumina may be used if the power consumption of semiconductor is small.

Holes 209a, 209b, 209c, 209d (not shown) in the corners of the metallic base 13 are for fixing the semiconductor device to an external cooling member.

Figure 3:
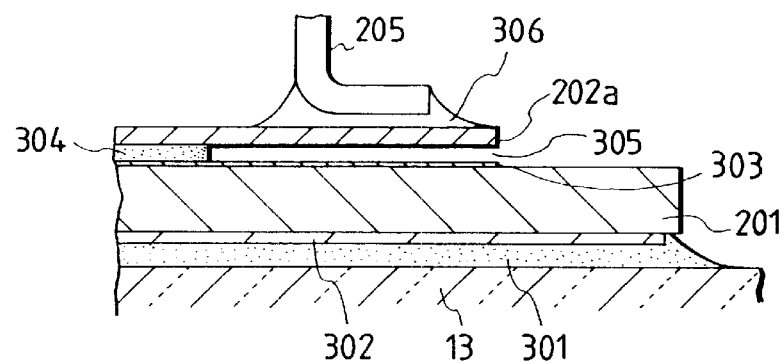
FIG. 3 is a cross-sectional view showing the terminal connecting portion of the substrate of a semiconductor device in accordance with the present invention.

Further, the cross-sectional structure of the collector terminal connecting position, foe example, 205a will be described in detail, referring to FIG. 3. Description will be made referring to the figure though there are some overlapping explanations. The Cu thin plate pattern 302 is bonded onto almost the whole bottom surface of the AlN ceramic substrate 13, and the Cu thin plate pattern and the metallic base 13 are bonded using a eutectic solder (the bonding layer between the Cu thin plate and the AlN ceramic substrate is omitted to illustrate). On the other hand, the Cu thin plate pattern is bonded to the other surface of the AlN ceramic substrate 201 with layer 304 of a solder added with Ti. The collector terminal connecting position 205 is bonded to the Cu thin plate pattern 202a using a eutectic solder 306. In the bonding portion under the Cu thin plate pattern, there is formed a gap 305 where the Cu thin plate pattern is not bonded. Further, a metallized layer 303 made of silver solder added with Ti is formed on the surface of the ceramic substrate in the gap portion.

Figure 14A:
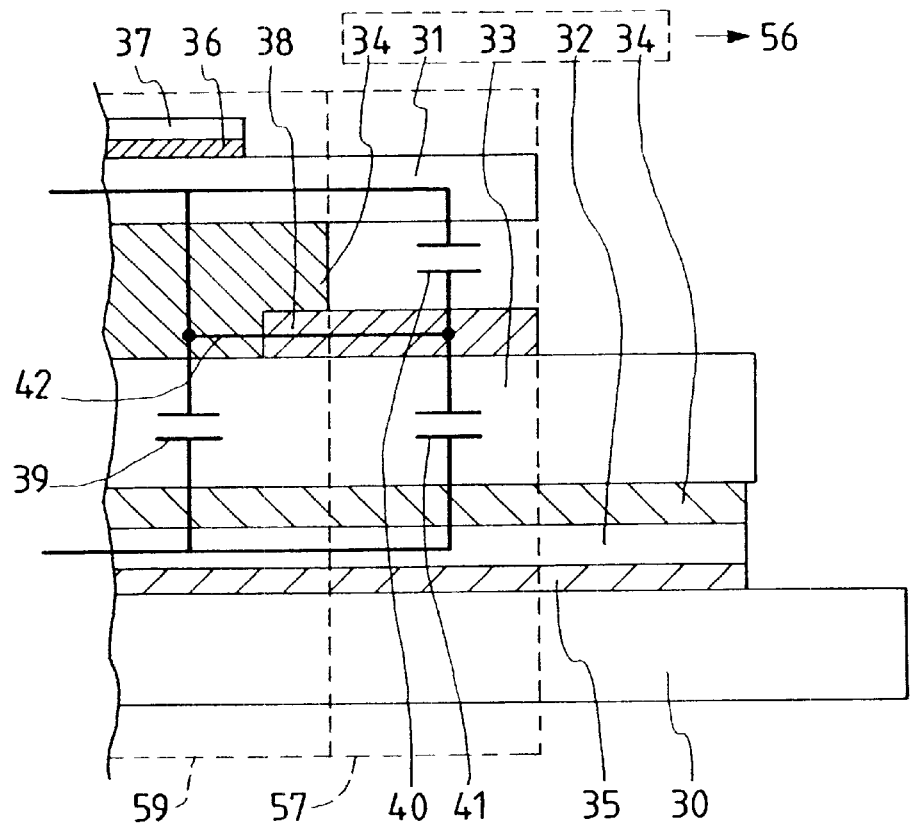
FIG. 14(a) is a partial view showing an embodiment of a semiconductor device in accordance with the present invention which mounts a circuit substrate having a dielectric layer around a metallic film, and 14(b) is a cross-sectional view of the device.
Figure 14B:
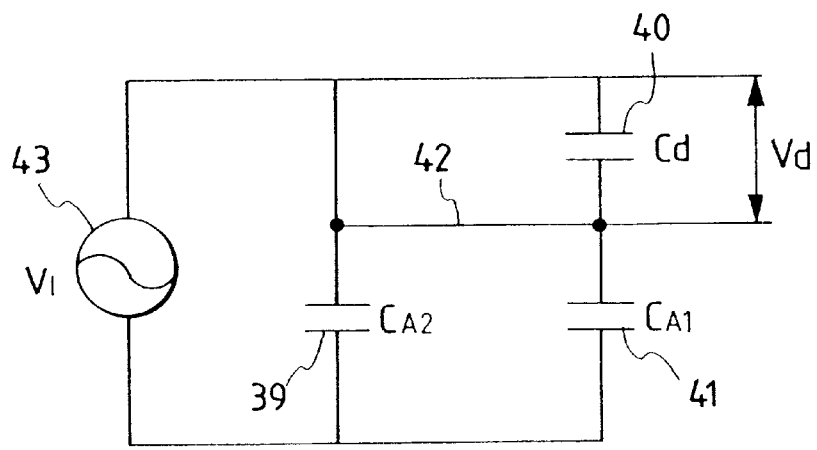

In FIG. 14, metallic films 31, 32 made of copper are bonded onto each of the surfaces of an insulator plate 33 made of aluminum nitride using a bonding material 34 made of silver as the main composition. There, the metallic film 31 is a first conductor layer which is wiring to form a circuit. The metallic films 31, 32, the insulator plate 33 and the bonding material 34 compose a so-called DBC board 56. Further, in the zone 57 where the insulator plate 33 and the metallic film 31 are not bonded, a layer 38 of conductor, that is, a second conductor layer is provided on the surface of the insulator plate 33 facing to the metallic film 31. Here, the layer 38 of conductor contacts to the bonding material 34. Therefore, the metallic films 31 and 32 are electrically connected to each other by the bonding material 34 of conductor.

A semiconductor element 37 is bonded on the metallic film 31 of the circuit board having such a construction using a solder 36. Further, the metallic film 32 and a conductive supporting board 30 made of a metal are bonded using a solder 35 having lead and tin as the main components. Such a supporting board mounting the circuit board bonding a semiconductor element is contained in an enclosed case to form a semiconductor module. In this embodiment, the semiconductor element 37 and the supporting board 30 are insulated by the insulator plate 33. In this embodiment, there are produced an insulating capacitance component by the insulator plate 33, that is, an insulating capacitance component 39 ($C_{A2}$) in a zone 59 bonded with the metallic film 31 and an insulating capacitance component 41 ($C_{A1}$) in a zone 57 not bonded with the metallic film as well as an insulating capacitance component 40 (Cd) by the gap between the metallic film 31 and the insulator plate 33 in a zone 57. $C_{A1}$ and $C_{A2}$ are connected in parallel by the metallic film 32, the layer 38 of conductor and the bonding material 34, and Cd is connected to this parallel circuit in series by the layer 38 of conductor and the bonding material 34. When voltage 43 V1 is applied to a module, voltage (Vd) is applied to Cd if the circuit is formed simply by connecting Cd in series to a parallel circuit of $C_{A1}$ and $C_{A2}$. At that time, if the gap forming Cd is an air layer or a vacuum layer, Vd becomes large to cause partial discharge because of a small dielectric constant. However, in this embodiment, Cd is short-circuited by the metallic film 31, the layer 38 of conductor and the bonding material 34. Therefore, Vd can be decreased and consequently the partial discharge can be suppressed.

In the above embodiment, in order to certainly suppress the partial discharge, it is necessary to form the layer of conductor so as not to form defects or separations such as pinholes. Although the vapor deposition method or the metallizing method is suitable as the film forming method, the metallizing method is preferable to increase the strength of contact between the insulator plate and the layer of conductor to prevent separation. However, it is not limited to these method as far as no defect and better capability of contact. As to materials for the film, a laminated film such as Au/Pt/Ti/AlN, Pt/Ti/AlN or a single component film may be employed. With considering the capability of contact to the insulator plate, a metallized film using W or a Mo—Mn alloy is preferable, but not limited. Further, by applying a closed-grained plating such as Ni plating on each of the metallized films, it is possible to eliminate defects such as pinholes.

The materials for the insulator plate, the metallic film and the bonding member are not limited to the materials described in the embodiments, it is possible to use various kinds of insulators for the insulator plate, and various kinds of conductors for the metallic film and the bonding member. The insulator plate and the metallic film may be bonded to each other by heating while the metallic film and the insulator plate are contacting to each other without using metallic solder. The insulator plate may be directly bonded onto the supporting board using a bonding material instead of attaching a metallic film onto the surface of the supporting board side of the insulator plate.

Figure 1B:
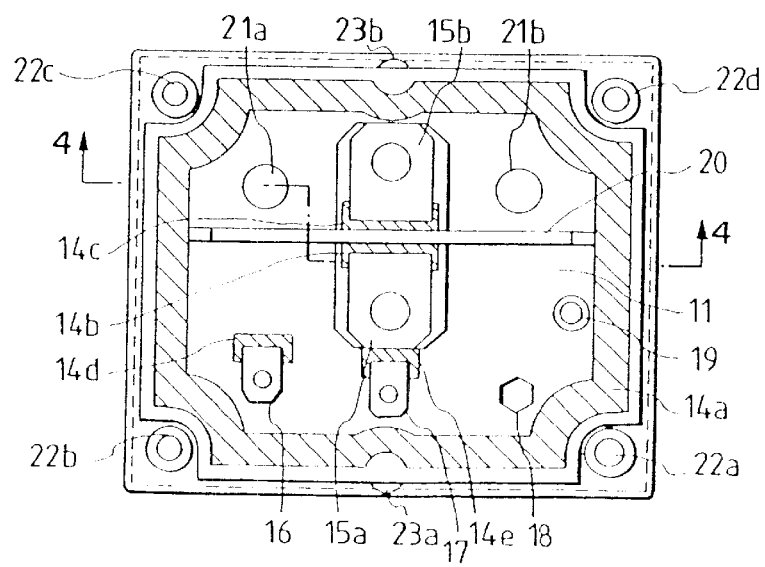
Figure 4:
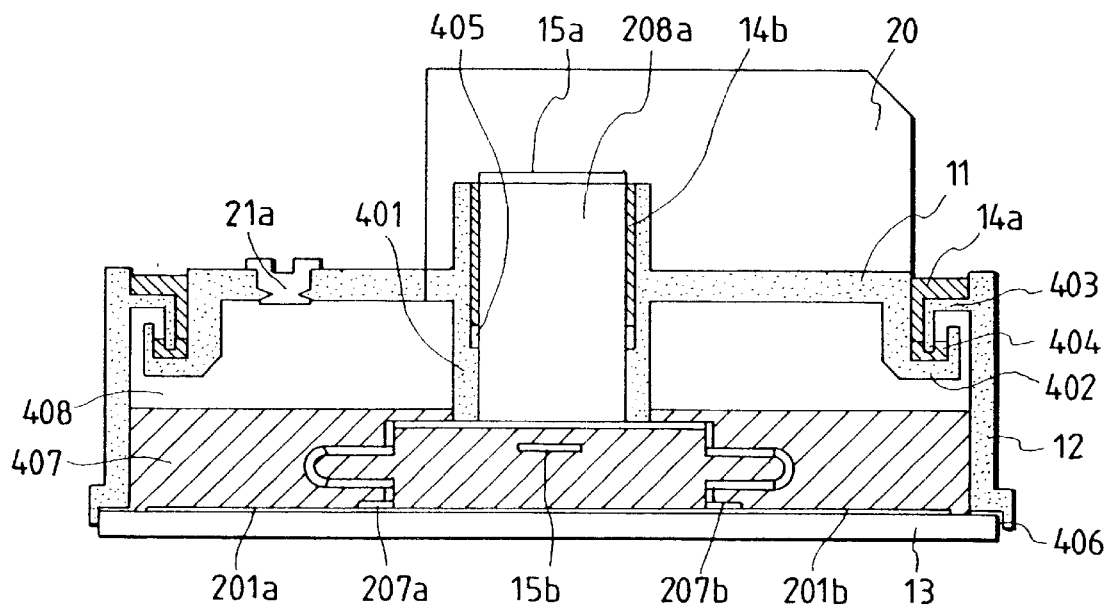
FIG. 4 is a cross-sectional view showing a semiconductor device in accordance with the present invention.

The structure will be described, referring to a cross-sectional view taking the plane along the line A–A' of FIG. 1(b). FIG. 4 is the cross-sectional view. The reference character 11 is the terminal block, the reference character 12 is the case, the reference character 13 is the metallic base, the reference character 20 is the insulator plate, the reference character 15a is the emitter terminal, the reference character 15b is the collector terminal, the reference characters 201a, 201b are the AlN ceramic substrates, the reference characters 207a, 207b are the emitter terminal connecting positions, the reference character 401 is a terminal cover mold member for covering the rising portion of the terminal and the lower end of the terminal cover mold member is dipped into the gel 407. The structural characteristics of the present invention will be described according to the manufacturing process.

The hermeticity between the terminal and the terminal cover mold member is obtained through two-stage resin injection. Initially, in terminal block manufacturing process, by injecting a resin 405 having a comparably high viscosity between the terminal block and the terminal, the both are fixed to each other without allowing the resin to flow out. By doing so, a terminal block having a high hermeticity can be obtained. The AlN ceramic substrates 201a, 201b connected with IGBT chip (not shown) are bonded onto the metallic base 13 using a solder. Next, the terminal block 11 is connected to the AlN ceramic substrates 201a, 201b through the emitter terminal connecting positions 207a, 207b using a solder. After cleaning, the case 12 is bonded to the periphery of the metallic base 13 using an organic adhesive agent 406. A first hard resin 404 is injected into a coupling portion 402 for the terminal block and the peripheral terminal block of the case and a coupling portion 403 for the case without over-flowing and is hardened. Then, a second hard resin 14a is injected into the coupling portion for the case and hardened. A hard resin 14b is injected into the terminal portion and hardened. Next, the silicone gel 407 is injected through a hole to fit a rubber cap 21a using a level gauge, and bubble removal is performed and then the silicon gel is hardened. It is clarified that in order to perform complete bubble removal, it is important not to contact the silicone gel 407 to the terminal block coupling portion 402 during removing bubbles. Finally, the rubber cap is fit to the hole and the assembling work is completed.

By the process and the structure described above, the following characteristics in regard to hermeticity can be obtained.

(i) Since the case and the terminal block are bonded using a hard resin before performing removal of bubbles, jointing failure of case using a hard resin due to raising-up of the gel along the wall is eliminated. Therefore, the hermeticity can be substantially improved.

(ii) Since a space can be provided above the surface of the gel by employing the coupling structure between the case and the terminal block described above, the interfering factor with hardening contraction of the gel is only the wall of the case and the gel can be almost freely contracted, and consequently there is no crack the gel, which is different from the conventional structure.

(iii) Since the space 408 is filled with the hard resin in the conventional structure, the weight of the device is very heavy. On the contrary, in the present invention, since the space can be made as an air layer, the weight of the device is light.

Figure 5A:
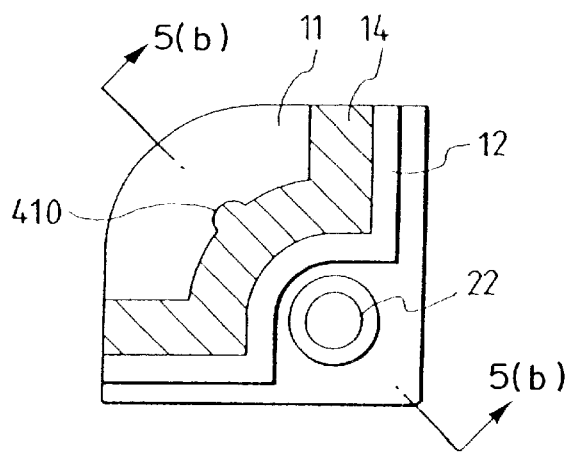
FIG. 5(a) is a plan view showing the corner of the attaching portion of a semiconductor device in accordance with the present invention, and 5(b) is a cross-sectional view of the corner of the attaching portion.
Figure 5B:
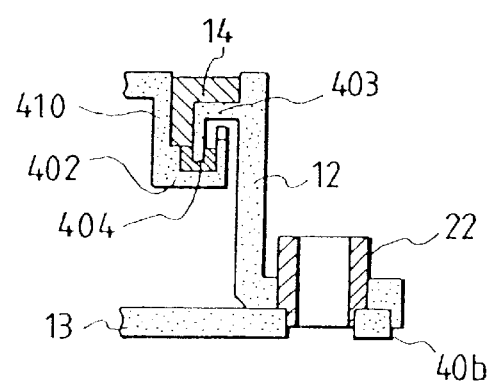

A further invention in regard to structure will be described, referring to FIG. 5. FIG. 5(a) is a plan view showing the corner of the attaching portion of a semiconductor device, and (b) is its cross-sectional view. In order to inject the first hard resin 404 described above without allowing to overflow, it is necessary to accurately control the level of the hard resin. Therefore, a setback portion 410 is provided, and the bottom of the setback portion 410 is used as the level for the first hard resin. By doing so, the first hard resin can be accurately injected and accordingly the trouble in over flow of the first hard resin 404 is completely eliminated during assembling. Although the setback portion 410 is provided in the corner of the case in the embodiment, the position is not limited to the corner.

Figure 15A:
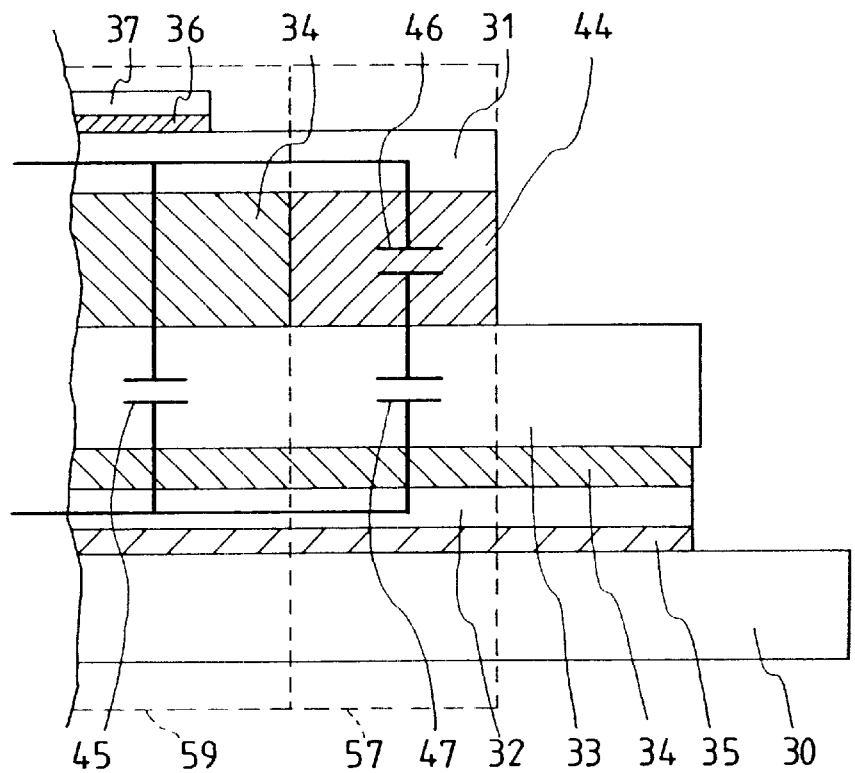
FIG. 15(a) is a cross-sectional view showing the structure, and 15(b) is a diagram showing the equivalent circuit of an embodiment in accordance with the present invention.
Figure 15B:
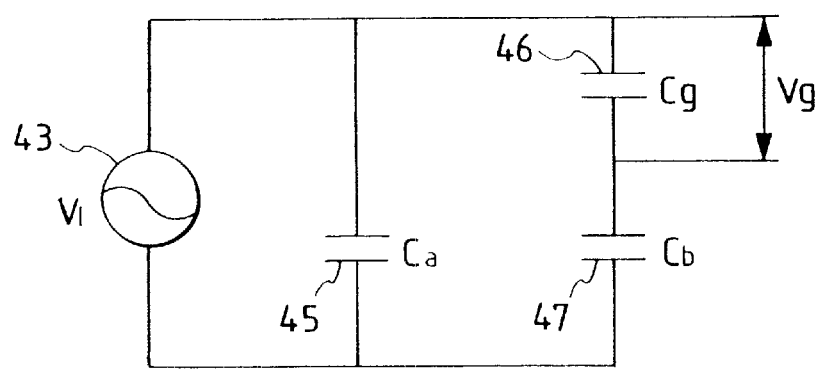

FIG. 15 shows the cross-sectional structure and the equivalent circuit of an embodiment in accordance with the present invention. The metallic films 31, 32 made of copper are bonded onto each of the surfaces of an insulator plate 33 made of aluminum nitride having thickness of 635 µm using a bonding material 34 made of a metallic solder having thickness of nearly 100 µm. This DBC board is bonded on the metallic supporting board 30 using solder 35. Further, a semiconductor element 37 is bonded onto the metallic film 31 on the insulator plate 33 using solder 36. There, the metallic film 31 becomes a circuit wiring pattern. There is a gap between the insulator plate 33 and the metallic film 31 where the both are not bonded with the bonding member 34. A dielectric material 44 is provided in the gap. An external terminal, not shown, is bonded on the metallic film 31 in the position of the gap. In this structure, even if a stress is applied to the external terminal, the stress is absorbed by the bending of the metallic film 31. Therefore, separation and crack are hardly occur in the terminal connecting portion.

The semiconductor element 37 and the metallic supporting board 30 are insulated by the insulator plate 33 inside the module. The insulating capacitance is determined by the distance between the end portion of the metallic film 31 in the circuit side and the end portion of the insulator plate 33, or the insulating capacity component 45 by the insulator plate 33. In the portion (zone 57) where the metallic film 31 and the insulator plate 33 are not bonded, an insulating capacitance component 46 is produced by the gap between the metallic film 31 and the insulator plate 33. When a voltage 43 V1 is applied to the module, a voltage Vg is split to the insulating capacitance 46 by the gap. In this embodiment, by inserting silicon rubber into the gap as a dielectric member 44, the voltage Vg applied between the both ends of the insulating capacitance component 46 of the gap is decreased lower than the voltage applied to the both ends of the insulating capacitance component 47 of the insulator plate 33 arranged in series to the above insulating capacitance component. Thereby, occurrence of the partial discharge is prevented.

There, since the dielectric constant of aluminum nitride (AlN) is 8.9 as shown in the table of FIG. 17, it is required from the equation (1) that the dielectric constant of the dielectric member is nearly 1.4. Since the dielectric constant of silicone rubber is 2.8 as shown in the table, the equation (1) is sufficiently satisfied.

By using silicone gel commonly used for coating and protecting semiconductor elements in a module as the dielectric member, occurrence of the partial discharge can be also prevented. In this case, the module assembling process can be simplified since the coating material and the dielectric member 44 are of the same material. Further, since the whole surface of the metallic film 31 can be coated with silicone gel, discharge due to concentration of electric field in the edge portions of the metallic film can be also suppressed.

As for the method of injecting dielectric material in a gap, there are various methods such as resin injection in vacuum, vacuum de-bubbling after injection, resin heating during injection for decreasing viscosity. Further, there is a method where resin is dropped a portion of a gap between the metallic film 31 and the insulator plate 33 to inject the resin utilizing the capillary phenomenon.

Figure 16A:
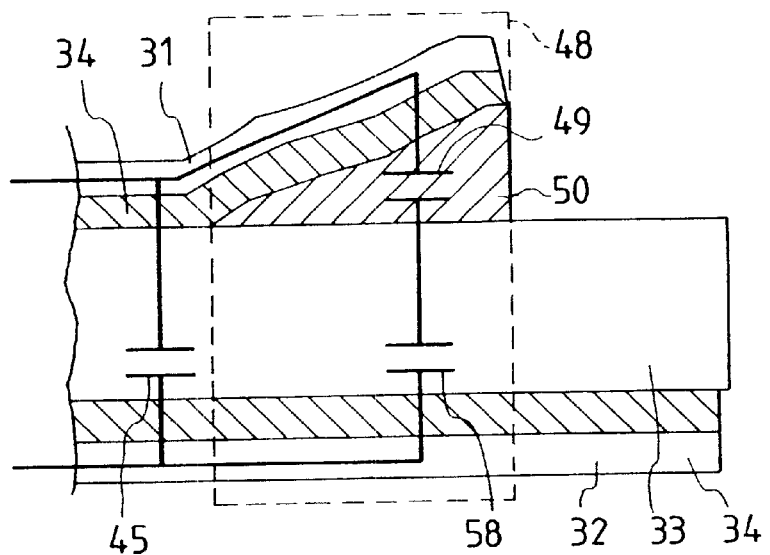
FIG. 16(a) is a view showing another embodiment in accordance with the present invention, and 16(b) shows a case where a crack is produced in the insulator plate.
Figure 16B:
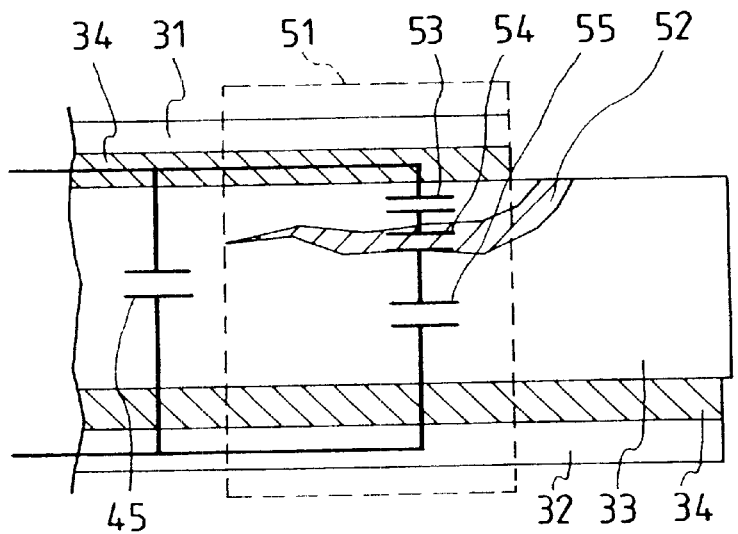

FIG. 16 shows another embodiment according to the present invention. The embodiment is for preventing the partial discharge when a DBC board is deteriorated during operation of the module. FIG. 16(a) shows a case where a separation occurs in the interface between the bonding member 34 and the insulator plate 33. At that time, an insulating capacitance component 49 is newly produced in the separation zone 48 by the separated gap in addition to the insulating capacitance component 58. However, by placing a fluid insulator member 50 (fluid dielectric material) such as silicone oil in the portion adjacent to the bonding layer, the partial discharge cannot occur even in the separated portion since the fluid insulator member 50 flows into the gap newly produced after assembling of the module. FIG. 16(b) shows a case where a crack 52 is produced in the insulator plate 33. The insulating capacitance component in the zone 51 where the crack occurs is split into three insulating capacitance components 53, 54, 55 due to the crack in the insulator plate 33. Partial discharge is apt to occur specially in the insulating capacitance component 54 since the portion is a gap produced by the crack. However, since the fluid insulator member is arranged in the portion adjacent to the insulator plate, the partial discharge cannot occur as the same as in FIG. 16(a).

These defects are caused near the metallic film 31 in the mounting side of the semiconductor element. However, there is a possibility that deterioration occurs in the side of the module supporting board. In this case, the partial discharge can be prevented by arranging the fluid insulator member in the portion adjacent to the bonding member 34 and the insulator plate 33.

Figure 6:
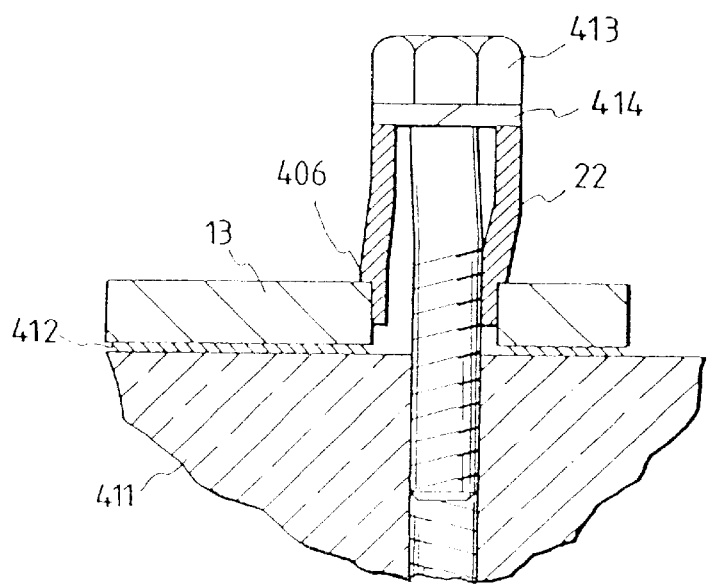
FIG. 6 is an explanatory view showing deformation of a fixing bolt.

An invention in relation to prevention of loosing of fixing bolt will be described below, referring to FIG. 6. In this figure, unnecessary portions for explaining are omitted. the reference character 13 is the metallic base, the reference character 22 is the collar, the reference character 411 is an external cooling member, the reference character 412 is a thermal conducting grease applied between the metallic base 13 and the external cooling member 411, the reference character 413 is a fixing bolt, and the reference character 414 is a washer. Now, let consider a case where the environmental temperature is raised. Cu or Al is commonly used for the external cooling member 411. On the other hand, the linear expansion coefficient of the metallic base is small and near that of silicon as described above. Therefore, the external cooling member 411 expands larger than the metallic base. The external cooling member 411 can easily slide against the metallic base because of existence of the grease 412.

When there is a collar 22, the thermal stress acting on the bolt is moderated by deformation of the collar itself. At that time, if the sliding force acting between the head of the bolt and the collar is smaller than the friction force between the both, the bolt is not loosed. In addition to this, the shearing stress acting on the bolt is also moderated and accordingly the bolt is not damaged. It is also preferable that the load acting on the bolt in its axial direction is not varied. Therefore, since the deformation of the collar and the metallic base preferably balances with the axial deformation of the bolt, the condition required for the linear expansion coefficient of the collar is equal to or larger than that of the bolt.

Figure 7A:
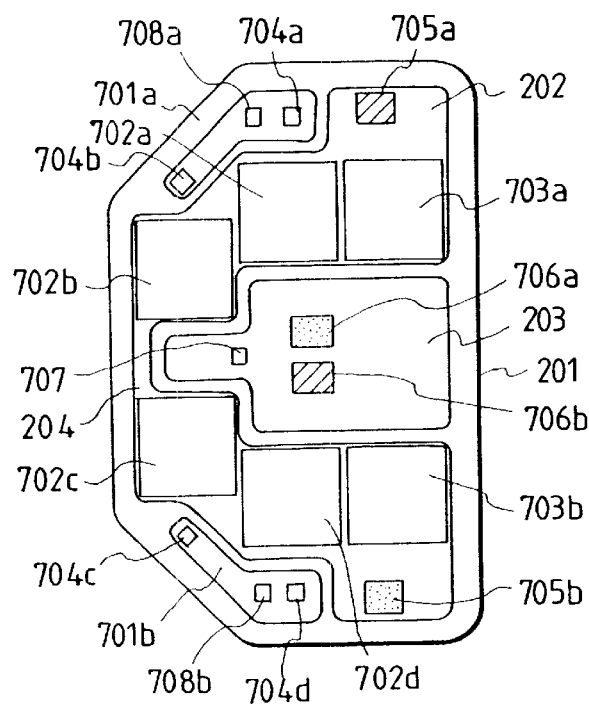
FIG. 7(a) is a plan view showing a ceramic substrate in a semiconductor device in accordance with the present invention, and 7(b) is an equivalent circuit diagram of the circuit formed on the ceramic substrate.

Arrangement of IGBT chips will be described below, referring to FIG. 7. FIG. 7(a) is a plan view showing the surface of the ceramic substrate where the IGBT chips are bonded, that is, where the aforementioned electrode terminals are connected. In FIG. 2, two ceramic substrates are illustrated, but one of the two is illustrated in this figure. That is, the other side of the substrate is also formed symmetrically. However, even if it is asymmetric, the basic idea of the present invention does not change. The reference character 201 is an AlN ceramic substrate bonded with Cu thin plate patterns on the both surfaces, the reference character 202 is a collector electrode Cu thin plate pattern, the reference character 204 is a Cu thin plate pattern for short-circuiting upper and lower collector electrode zones, the reference character 203 is an emitter pattern formed by a Cu thin plate, the reference characters 701a, 701b are gate patterns formed by Cu thin plates, the reference characters 702a, 702b, 702c, 702d are the IGBT chips, the reference characters 703a, 703b are diode chips connected to the IGBT chip in parallel for allowing current to flow in the opposite direction when the IGBT chip is in OFF state, the reference characters 704a, 704b, 704c, 704d are inner gate resistors which are not connected in some cases. The reference characters 705a, 705b indicate collector terminal connecting positions where the collector electrode terminals are connected. These are corresponding to the 205c/205b and 205a/205d in FIG. 2. The reference characters 706a, 706b indicate emitter terminal connecting positions where the emitter electrode terminals are connected. These are corresponding to 207a and 207b in FIG. 2 (in FIG. 2, terminals are omitted). The reference character 707 is an emitter auxiliary terminal position for extract emitter voltage, and the reference characters 708a, 708b are gate terminal connecting positions connected with the gate electrode terminals. In FIG. 2, the electrode terminals corresponding to 707, 708 are omitted.

Figure 7B:
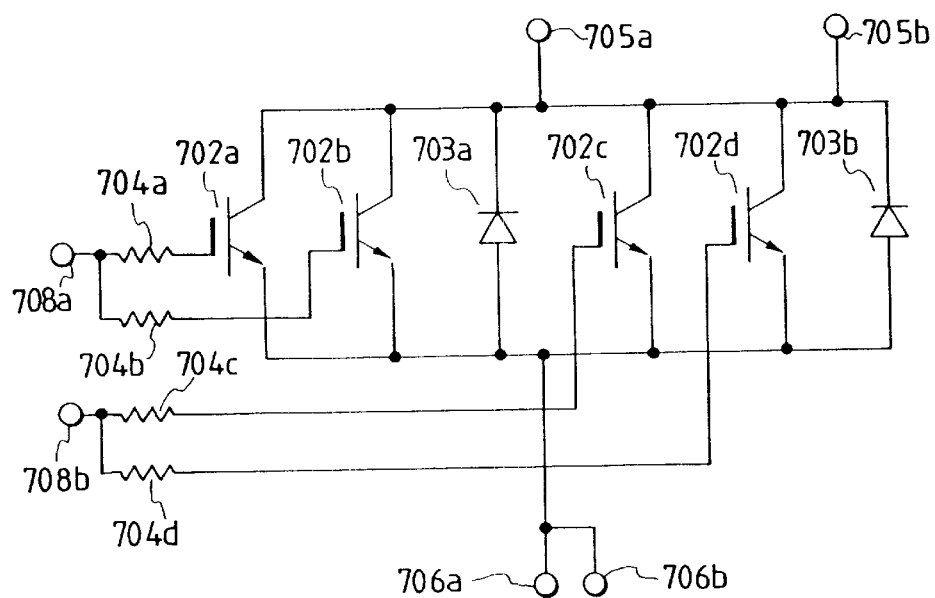

FIG. 7(b) shows the equivalent circuit. Since each of the reference characters is corresponding to each of FIG. 7(a), explanation is omitted. Since in the semiconductor device in FIG. 2 the circuit of FIG. 7(b) is further connected in parallel, it can be understood that eight IGBT chips and four diode chips are connected in parallel. It is not always required that the semiconductor device has the same number of chips, but the number of chips can be varied depending on the current capacity of the device. When the semiconductor device is seen as a black box, the semiconductor device in the embodiment can be considered to be a single IGBT element connected with a diode in parallel. All the IGBT elements are turned ON/OFF at a time. The diode elements are turned OFF/ON in the inverse operation of the IGBT. That is, the IGBT element and the diode element basically does not generate heat at a time. Therefore, it is necessary that the IGBT chips among themselves and the diode chips themselves are arranged dispersedly as much as possible to prevent concentration of heat generation. Although this idea is very important when the thermal conductivities of the substrate and the heat dissipating plate are small, it is also effective when the thermal conductivity of the heat dissipating plate is as large as Cu. On the other hand, it is no need to separate the IGBT chip and the diode chip. In order to perform parallel operation of the IGBT chips uniformly, it is important that there is no time difference in emitter-gate voltage among chips. The key point is that the inductance of the emitter circuit is suppressed as low as possible. From this idea, in the present invention leads the lay-out shown in FIG. 7.

(1) The four IGBT chips are arranged in two chips in each zone.
(2) The two collector zones are short-circuited by the conductor 204 to make the currents in the two collector zone uniform.
(3) The IGBT chips in each zone are arranged unevenly and apart from each other.
(4) The IGBT chip and the diode chip are adjacently arranged.
(5) The emitter pattern is arranged in the center portion of the substrate to shorten the emitter wiring in order to lessen its inductance.
(6) The emitter terminal connecting positions 706a, 706b are arranged near the center of the emitter pattern 203 to protect the ceramic under the terminal from cracking with so-called sucking disc effect.
(7) The distance between the edge of the Cu pattern and the edge of the ceramic substrate in the side facing to the other substrate (right hand side in the figure) is formed larger than that in the other sides. The reason is that since the solder in the side facing to the other substrate is apt to swell, the distance becomes short.

Embodiments of semiconductor modules according to the present invention will be described below.

Figure 18:
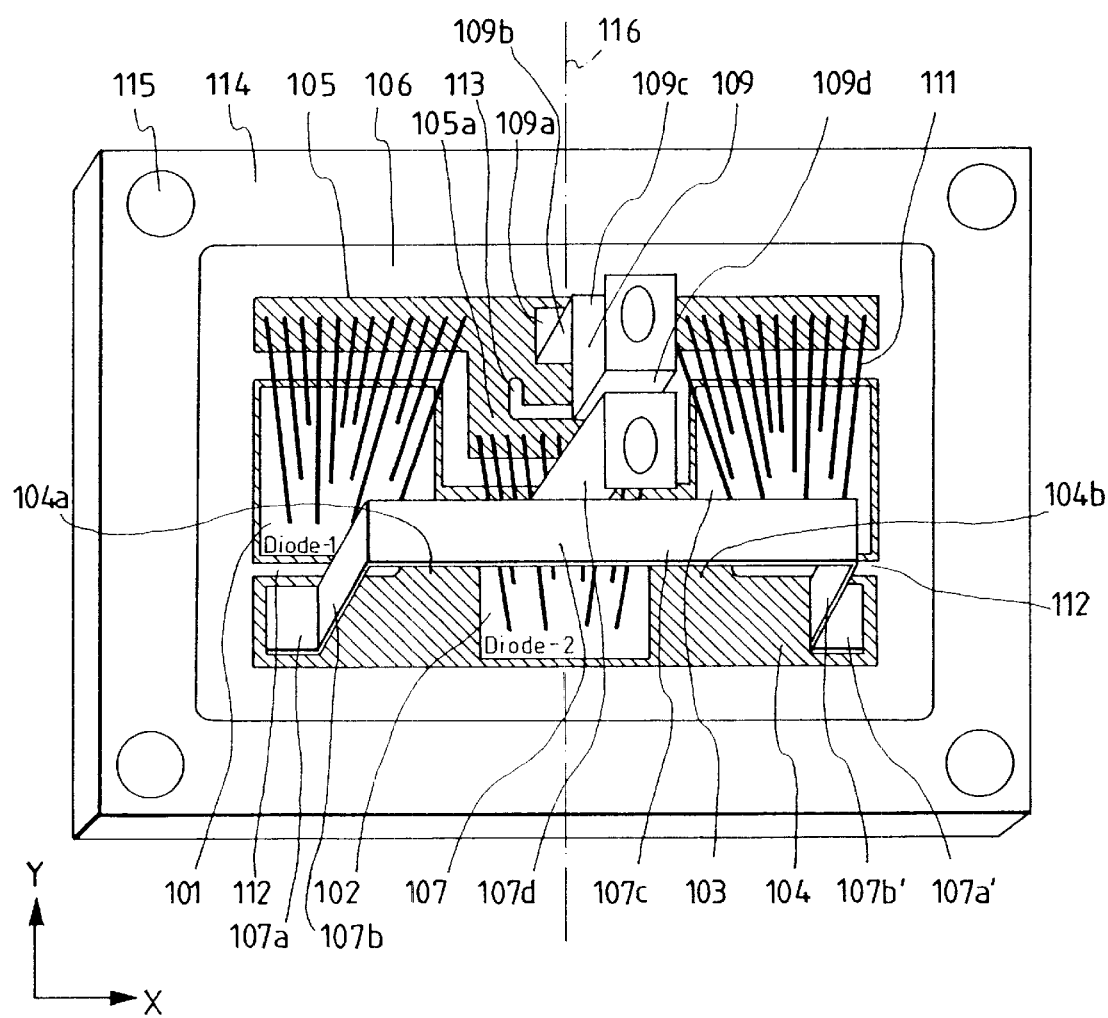
FIG. 18 is a perspective view showing the first embodiment of a semiconductor module in accordance with the present invention (the casing is omitted).

Firstly, the first embodiment of a semiconductor module according to the present invention will be described, referring to FIG. 18 to FIG. 24. The semiconductor module of this embodiment mounts three diode elements 101, 102, 103 of same kind and same size as shown in FIG. 18. Each of the diode elements 101, 102, 103 is square-plate-shaped, and on the top surface of the diode element there is an anode electrode (input electrode) through which current flows in from the external, and on the bottom surface there is a cathode electrode (output electrode) through which current floes out to the external.

Figure 19:
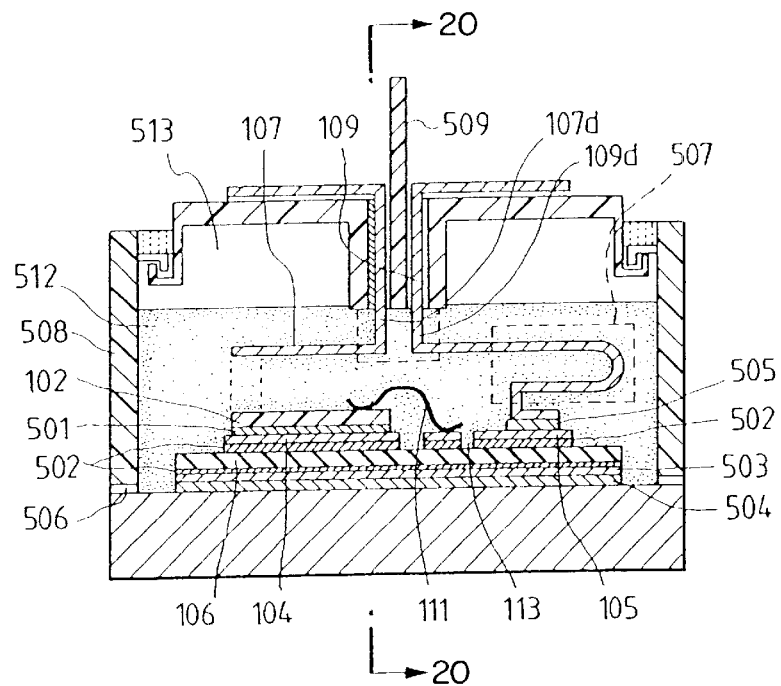
FIG. 19 is a cross-sectional view showing the first embodiment of the semiconductor module in accordance with the present invention.
Figure 20:
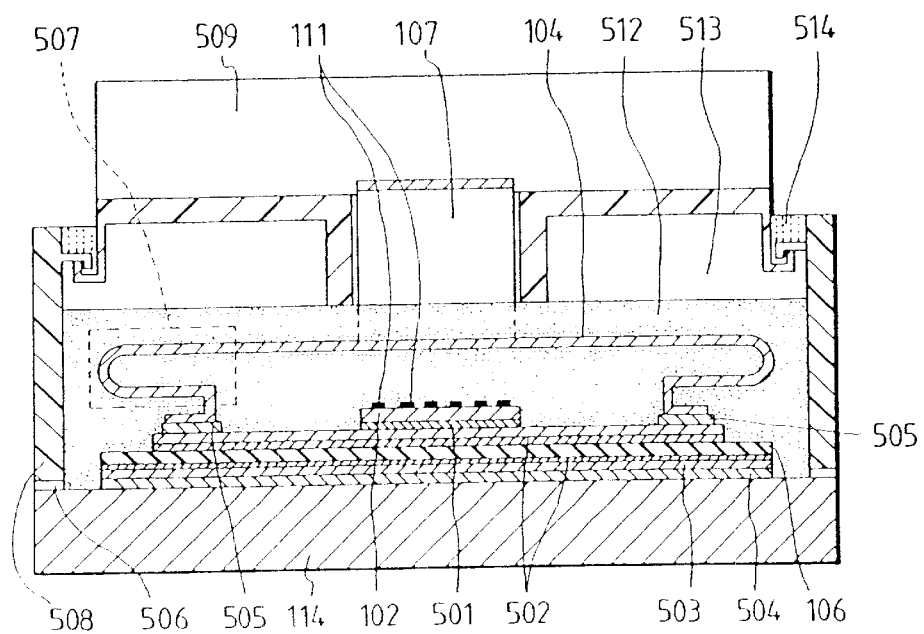
FIG. 20 is a cross-sectional view taking the plane along the line A—A in FIG. 19.

The semiconductor module comprises, as shown in FIG. 18 to FIG. 20, the three diodes 101, 102, 103 as described above, a metallic supporting board 114, a rectangular insulator substrate 106 provided on the supporting board 114, an anode side conductor pattern 105 electrically connected to the anode electrodes on the top surfaces of the diode elements 101, 102, 103 in parallel, a cathode side conductor pattern 104 electrically connected to the cathode electrodes on the bottom surfaces of the diode elements 101, 102, 103 in parallel, an anode side connecting terminal 109 forming a connecting terminal for an external apparatus by being connected to the anode side conductor pattern 105, a cathode side connecting terminal 107 forming a connecting terminal for an external apparatus by being connected to the cathode side conductor pattern 104, cases 508, 509 coating the diode elements and so on, and silicone gel 512 shielded in the inner space formed by the supporting board 114 and the cases 508, 509.

For the sake of convenience of explanation, here let the direction parallel to the longer side of the rectangular insulator substrate 106 be X-direction, and the direction perpendicular to the X-direction be Y-direction.

Figure 21:
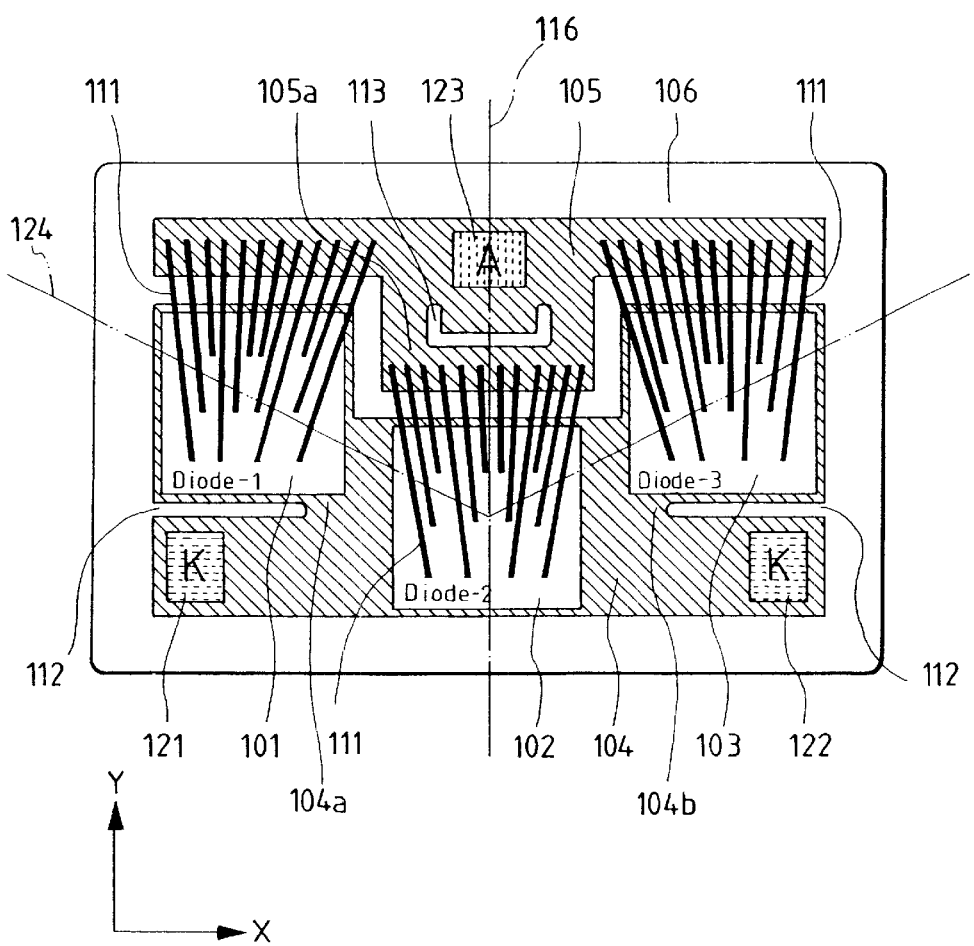
FIG. 21 is an explanatory view showing the shape of conductor pattern and the configuration of diode elements in the first embodiment of the semiconductor module in accordance with the present invention.

The anode side conductor pattern 105 and the cathode side conductor pattern 104 are, as shown in FIG. 21, formed on the insulator substrate 106 so as to become symmetrical in regard to the center line 116 (parallel to the Y-direction) of the rectangular insulator substrate 106. The anode side conductor pattern 105 is formed in extending in the X-direction in the +Y side of the insulator substrate 106, and projecting toward the −Y-direction at a portion near the center line 116. A portion on the center line 116 in the +Y side of the anode side conductor pattern 105 is a bonding zone 123 for the anode side connecting terminal 109. The cathode side conductor pattern 104 is formed in extending in the X-direction in the −Y side of the insulator substrate 106, and depressing in the −Y-direction at a portion near the center line 116. The end portion in the +X side and the end portion in the −X side in the −Y side of the cathode side conductor pattern 104 are bonding zones 121, 122 of the cathode side connecting terminal 107. The end portion in the +X side and the end portion in the −X side in the +Y side of the cathode side conductor pattern 104 are mounting zones for the first and third diode elements 101, 103, and a portion on the center line 116 in the −Y side of the cathode side conductor pattern 104 is a mounting zone for the second diode element 102. The cathode side conductor pattern 104 between the mounting zone for the first diode element 101 and the first bonding zone 121 for the cathode side connecting terminal 107 is cut away to form a slit 112. Similarly, the cathode side conductor pattern 104 between the mounting zone for the third diode element 103 and the second bonding zone 122 for the cathode side connecting terminal 107 is also cut away to form a slit 112. Further, the anode side conductor pattern 105 between the mounting zone for the second diode element 102 and the second bonding zone 123 for the anode side connecting terminal 109 is also cut away to form a slit 113.

The anode side connecting terminal 109, as shown in FIG. 18, comprises a bonding portion 109a bonded to the bonding zone 123 of the anode side conductor pattern 104, a rising portion 109b vertically rising from the bonding portion 109a, an inducing portion 109c extending in the −Y-direction from the top of the rising portion 109b, a facing portion 109d vertically rising from the −Y side end of the inducing portion 109c, and a bolt fixing portion 110 extending toward the +Y-direction from the top end of the facing portion 109d. A bolt is attached to the bolt fixing portion 110, and a lead wire from an external apparatus is fixed to this portion. The cathode side external connecting terminal 107 comprises a first bonding portion 107a bonded to the first bonding zone 121 of the cathode side conductor pattern 104, a second bonding portion 107a′ bonded to the second bonding zone 122 of the cathode side conductor pattern 104, rising portions 107b, 107b′ vertically rising from the bonding portions 107a, 107a′ respectively, an inducing portion 107c approaching toward the center line 116 from the top ends of the rising portions 107b, 107b′ respectively, a facing portion 107d vertically rising from the center of the inducing portion 107c, that is, on the center line 116, and a bolt fixing portion 108 extending toward the −Y-direction from the top end of the facing portion 107d. A bolt is attached to the bolt fixing portion 108, and a lead wire from an external apparatus is fixed to this portion.

The effects of the embodiment due to each of the conductor patterns 104, 105 and the shapes of the external connecting terminals 107, 109 will be described here, referring to FIG. 21 to FIG. 23.

In this embodiment, as described above referring to FIG. 21, there are formed the slits 112, 112, 113 between the mounting zone of the first diode 101 and the first bonding zone 121 of the cathode side connecting terminal 107, between the mounting zone of the third diode 103 and the second bonding zone 122 of the cathode side connecting terminal 107, and between the mounting zone of the second diode 102 and the bonding zone 123 of the anode side connecting terminal 109. In the second diode 102, the average distance from the anode electrode to the bonding zone 123 of the anode side connecting terminal 109 is shorter than those of the other semiconductor elements 101, 103. Here, the reason using the term "average distance" is that the anode electrode has a certain expansion. Therefore, among the current paths between the bonding zone 123 of the anode side connecting terminal 109 and each of the semiconductor elements 101, 102, 103, the current path to the second diode 102 usually becomes the shortest. Therefore, the current flowing between the mounting zone of the second diode 102 and the bonding zone 123 of the anode side connecting terminal 109 is bypassed to make each of the current paths for the plural semiconductor elements 101, 102, 103 nearly an equal length. For doing so, a part of the path is cut away to form a current bypass portion 105a. The current bypass portion 105a is connected with one end of a metallic wire 111 which is connected to the anode electrode of the second diode 102. In the first diode 101 and the third diode 103, the average distances from the cathode electrode to the bonding zones 121, 122 of the cathode side connecting terminal 107 are shorter than that of the other semiconductor element 102. Therefore, the current flowing between the mounting zones of the first and third diodes 101, 103 and the bonding zones 121, 122 of the cathode side connecting terminal 107 are bypassed to make each of the current paths for the plural semiconductor elements 101, 102, 103 nearly an equal length. For doing so, a part of the paths are cut away to form current bypass portion 104a, 104b.

Figure 22:
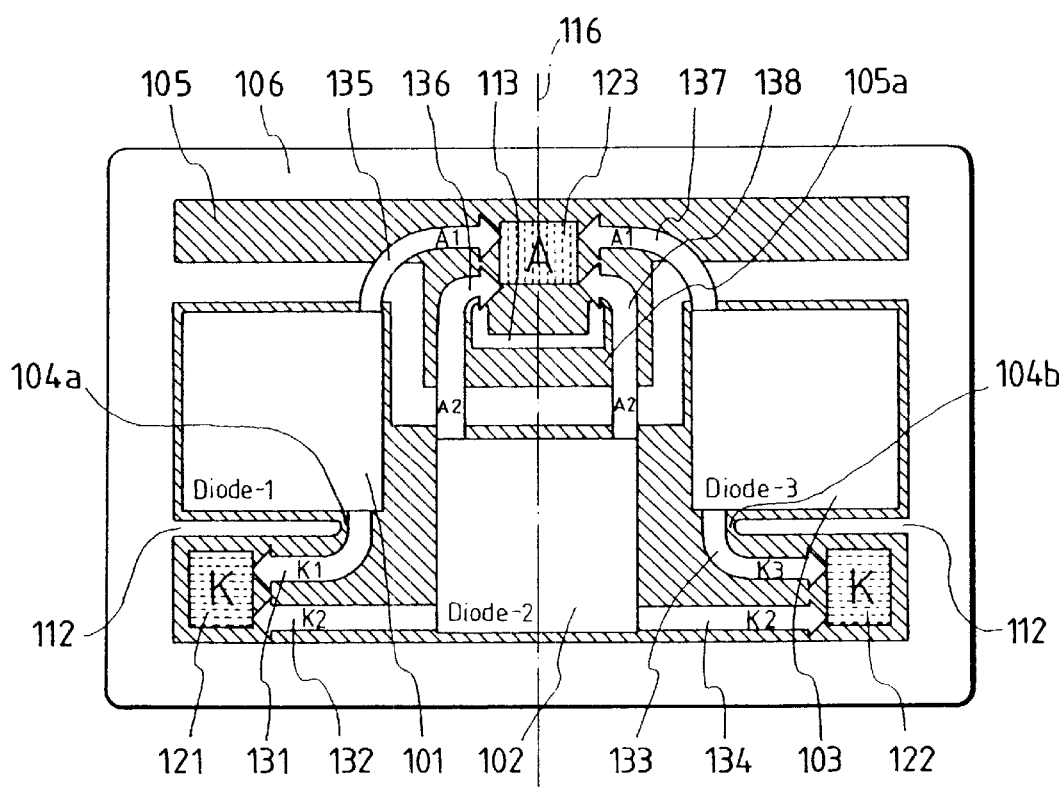
FIG. 22 is an explanatory view showing the current path in the first embodiment of the semiconductor module in accordance with the present invention.
Figure 23A:
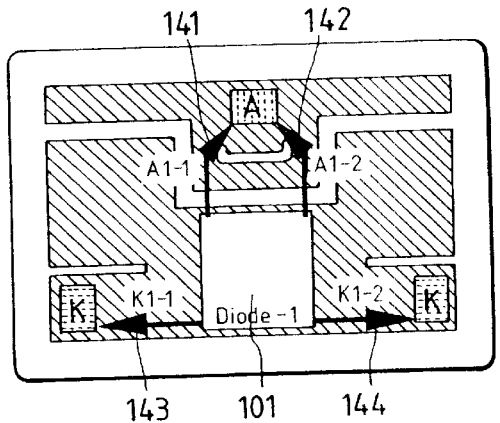
FIGS. 23(a)–23(e) are explanatory views showing the layout of semiconductor elements in a semiconductor module. 23(a) is a case where there is a current cut-off pattern in a metallic film, and number of semiconductors is one. 23(b) is a case where there is no current cut-off pattern in a metallic film, and number of semiconductors is one. 23(c) is a case where there is a current cut-off pattern in a metallic film, and number of semiconductors is two. 23(d) is a case where there is no current cut-off pattern in a metallic film, and number of semiconductors is two. 23(e) is a case where there is a current cut-off pattern in a metallic film, and number of semiconductors is two.
Figure 23B:
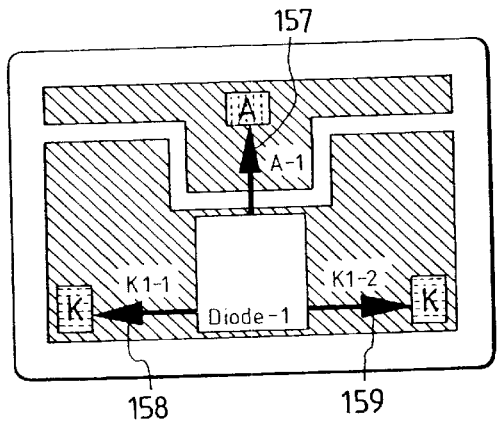
Figure 23C:
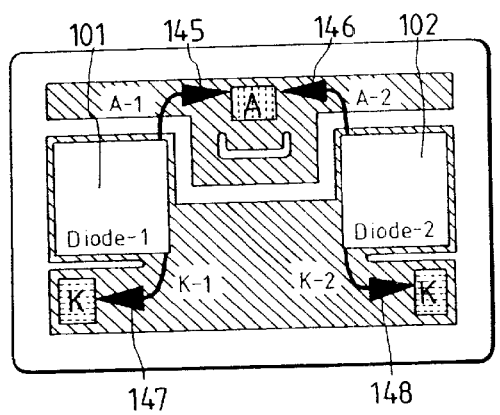
Figure 23D:
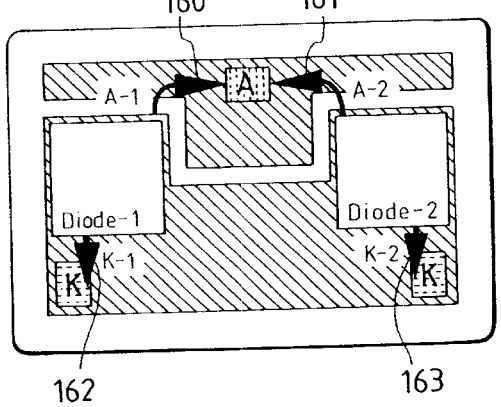
Figure 23E:
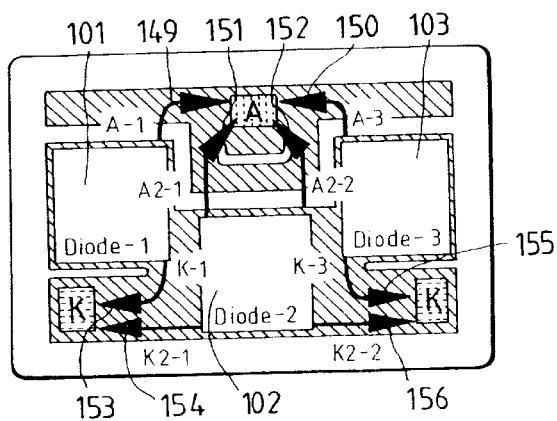

FIG. 22 a view showing the current paths from the diode elements 101, 102, 103 to the bonding zones 121, 122, 123 of the external connecting terminals 107, 109. In the cathode side, the length (K1) of the current path 131 from the first diode element 101 to the first bonding zone 121 of the cathode side connecting terminal 107 and the length (K2) of the current path 132 from the second diode element 102 to the first bonding zone 121 of the cathode side connecting terminal 107 are nearly equal (K1=K2). Since the pattern is symmetrical, the length (K3) of the current path 133 from the third diode element 103 to the second bonding zone 122 of the cathode side connecting terminal 107 and the length (K2) of the current path 134 from the second diode element 102 to the second bonding zone 122 of the cathode side connecting terminal 107 are nearly equal (K2=K3). In the anode side, the length (A1) of the current path 131 from the first diode element 101 to the bonding zone 123 of the anode side connecting terminal 109 and the length (A2) of the current path 136 from the second diode element 102 to the bonding zone 123 of the anode side connecting terminal 109 are nearly equal (A1=A2). Since the pattern is symmetrical, the length (A1) of the current path 137 from the third diode element 103 to the bonding zone 123 of the anode side connecting terminal 109 and the length (A2) of the current path 138 from the second diode element 102 to the bonding zone 123 of the anode side connecting terminal 109 are nearly equal (A1=A2).

Therefore, all the inductances between the semiconductor elements 101, 102, 103 and the bonding zone 121, 122, 123 of the external connecting terminals 107, 109 are nearly equal to one another, and accordingly the current flowing to each of the elements can be made equal. As the result, the spike noise during operation of a diode module can be decreased, and the heat generating rates of the elements can be uniform. Therefore, the reliability in the solder 505 and metallic wire 111 bonding each of the elements can be improved.

Each of the elements has each anode electrode having a certain expansion. Therefore, even if the length of the current path 131 from a certain position in the anode electrode of the first diode element 101 to the bonding zone 123 of the anode side connecting terminal 109 and the length of the current path 136 from a certain position in the anode electrode of the second diode element 102 to the bonding zone 123 of the anode side connecting terminal 109 are made equal to each other, the length of the current path 131 from another position in the anode electrode of the first diode element 101 to the bonding zone 123 of the anode side connecting terminal 109 and the length of the current path 136 from a certain position in the anode electrode of the second diode element 102 to the bonding zone 123 of the anode side connecting terminal 109 are not exactly equal. In the embodiment, the meaning "to make the length of each of the current paths nearly equal to each other" is that the difference in lengths of the shortest current path in each semiconductor elements is shorter than one half of one side-length of the semiconductor element. The semiconductor element in the embodiment is square plate-shaped. In a case of rectangular plate-shaped elements, the meaning "to make the length of each of the current paths nearly equal to each other" is that the difference is shorter than one half of the length of the longer or shorter side of the element along which the current path crosses. In a case of cylinder elements, the meaning is that the difference is shorter than one half of the diameter of the element.

Since the conductor patterns 104, 105 on the insulator substrate 106 play a role in improving the cooling effect by dissipating heat generated in the diode elements, it is preferable to lessen the sizes of the slits 112, 113 as small as possible. Therefore, as shown in FIG. 21, the position of the second diode element 102 in the center is shifted toward the −Y direction from the other diode elements 101, 103 so that the centers of weight of the diode elements 101, 102, 103 does not come on a straight line. The second diode element 102 is moved close to the bonding zones 121, 122 and away from the bonding zone 123 to shorten the length of the slits 112, 113. By shifting the second diode element 102 from the other diode elements 101, 103, the heat generating positions can be dispersed. It is necessary to design the slits 112, 113 in taking the current density in the conductor pattern into consideration so that the conductor pattern itself generates much heat by extreme current concentration. In this case, the current density is preferably suppressed 100 A/mm$^2$ at maximum as a target although it depends on the cooling effect of the module. By arranging the slits 112, 113 near the bonding zones 121, 122, 123 of the external connecting terminals 107, 109, it is possible to suppress the solder 505 bonding the external connecting terminal 107, 109 and the conductor pattern 104, 105 to flow, and it is easy to position the terminals at assembling the module by utilizing the slits 112, 113 as positioning marks. As described above, by suppressing the solder 505 to flow, the thickness of the solder 505 used for connection of terminals can be made uniform, and degradation of the solder by thermal cycle during operation can be decreased, and further the size if the module can be decreased by decreasing the marginal area against flowing of solder.

FIG. 23 shows a case where number of diode elements in a module is changed. In a case of one diode element or two diode elements, as shown in FIGS. 23(*b*), (*d*), it is possible to make the current path lengths from the anode electrode or the cathode electrode of each element to the bonding zone of the external connecting terminal nearly equal only by making the shape of each conductor pattern, the arrangement of each element and arrangement of bonding zones of the external connecting terminals symmetrical without forming slit in the conductor pattern. In other words, in the case of FIG. 23(*b*), the relation K1-1(158)=K1-2(159) can be obtained. In the case of FIG. 23(*d*), the relations A-1(160)=A-2(161) and K-1(162)=K-2(163) can be obtained. However in a case of three semiconductor elements, it is impossible to make the current path lengths from the anode electrode or the cathode electrode of each element to the bonding zone of the external connecting terminal nearly equal without slits in the conductor pattern. By making the shape of each conductor pattern symmetrical and forming the silts in the conductor pattern as in the embodiment, it is possible to make the current path lengths from the anode electrode or the cathode electrode of each element to the bonding zone of the external connecting terminal nearly equal in any case of one diode element, two diode elements and three diode elements as shown in FIGS. 23(*a*), (*b*), (*c*). In other words, in the case of FIG. 23(*a*), the relations A-1(141)=A-2(142) and K-1(143)=K-2(144) can be obtained. In the case of FIG. 23(*c*), the relations A-1(145)=A-2(146) and K-1(147)=K-2(148) can be obtained. In the case of FIG. 23(*e*), the relations A-1(149)=A2-1(151)=A2-2(152)=A-3(150) and K-1(153)=K2-1(154)=K2-2(156)=K-3(155) can be obtained.

By making the shape of each conductor pattern symmetrical and forming the silts in the conductor pattern as in the embodiment, it is possible to cope with various number of semiconductors and to improve the versatility of module.

In the embodiment, the arrangement of the diode elements 101, 102, 103, the shape of the conductor patterns 104, 105, the shape of the external connecting terminals 107, 109 and the arrangement of bonding zones 121, 122, 123 of the external connecting terminals 107, 109 symmetrical without forming slit in the conductor pattern are symmetrical in regard to the center line 116 of the insulator substrate 106. Basically, in order to make the inductance of each element equal, it is possible to design the slits 112, 113 properly. However, it is very complex to design the slits 112, 113 for making the inductances equal unless the shape of the conductor patterns 112, 113 and the like are symmetrical. Further, as described above referring to FIG. 23, the degree of freedom in regard to number of semiconductor elements and the layout of the semiconductor elements is decreased. Therefore, in the embodiment, the shape of the conductor patterns 112, 113 and the like are symmetrical in order to easily design for making the inductance to each element equal and to increase the degree of freedom in regard to number of semiconductor elements and the layout of the semiconductor elements.

In general, an inductance L of each of two parallel wires is given by the following equation.

$$L = 4 \times 1 \cdot \ln(D/r) \qquad \text{(Equation 2)}$$

where 1 is length of the wire, D is distance between the wires, and r is radius of the wire.

Figure 24:
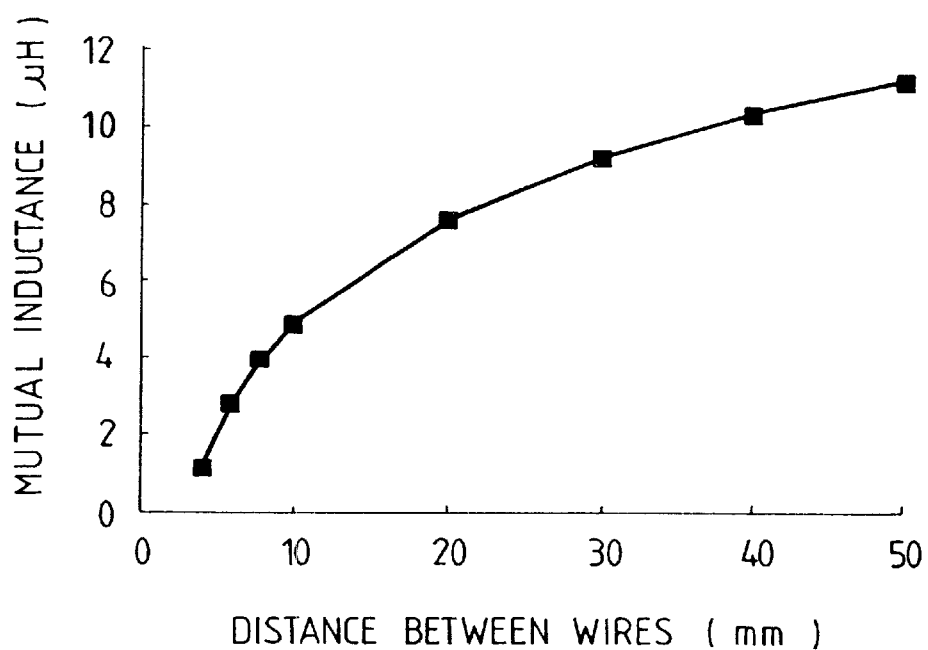
FIG. 24 is a graph showing the relationship between distance between wires in parallel wiring and mutual inductance.

When the currents in the parallel wires are flowing in the same direction, the self-inductances are mutually increased. When the currents in the parallel wires are flowing in the opposite directions, the self-inductances are mutually canceled. In the case where the currents in the parallel wires are flowing in the opposite directions, the mutual inductance is rapidly decreased when the distance between the wires D becomes below 10 mm as shown in FIG. 24.

In the embodiment, as shown in FIG. 19, the facing portion 109*d* of the anode side connecting terminal 109 and the facing portion 107*d* of the cathode side connecting terminal 107 are parallel to and facing to each other, and the gap between them is less than 10 mm. Further, the directions of the currents flowing in the facing portion 109*d* of the anode side connecting terminal 109 and in the facing portion 107*d* of the cathode side connecting terminal 107 are opposite. Therefore, the inductance in the module can be substantially decreased. Incidentally, in the embodiment, since the width of the facing portion 107*d*, 109*d* of the external connecting terminals 107, 109, that is, the radius of wire is 3 mm. The calculation of the inductance in FIG. 24 is performed based on wire length 1 of 10 mm and wire radius of 3 mm to meet with the condition of the embodiment.

The second embodiment of a semiconductor module according to the present invention will be described below, referring to FIG. 25 and FIG. 26.

Figure 25:
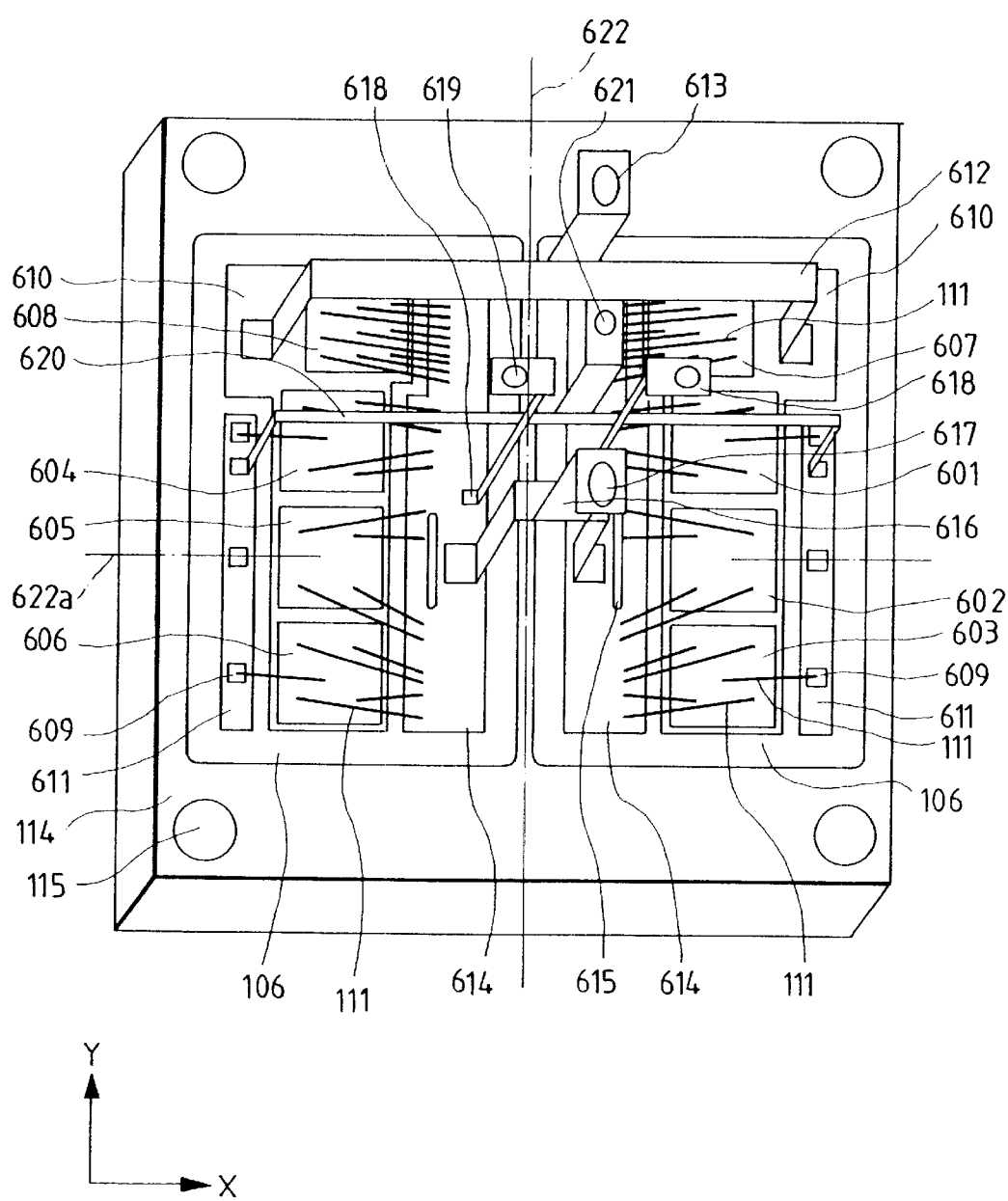
FIG. 25 is a perspective view showing the second embodiment of a semiconductor module in accordance with the present invention.

The semiconductor module in this embodiment comprises two sets of insulator substrates each of which mounts three IGBT elements and one diode element as shown in FIG. 25. The IGBT element is square plate-shaped, having an emitter electrode (input electrode) and a gate electrode (control electrode) on the top surface, and a collector electrode (output electrode) on the bottom surface.

On a metallic supporting board 114, two insulator substrates 106, 106 made of aluminum nitride are arranged symmetrically in regard to the center line 622 of the metallic supporting board 114. On one of the insulator substrate 106, conductor patterns 610, 611, 614 made of copper are formed. Among the conductor patterns 610, 611, 614, on the collector side conductor pattern 610, the IGBT elements 601, 602, 603 and the diode element 607 are arranged and a collector side connecting terminal 612 is bonded. The collector side connecting terminal 612 has two legs one of which is bonded to the collector side conductor pattern 610 on one of the insulator substrates 106. On the gate side conductor pattern 611, three gate resistor elements 609 are arranged and a gate side connecting terminal 620 is bonded. The gate side connecting terminal 620 also has two legs one of which is bonded to the gate side conductor pattern 611 on one of the insulator substrates 106. On the emitter side pattern 614, a slit 615 is formed and an emitter side connecting terminal 616 and an emitter auxiliary connecting terminal 618 are bonded. The emitter side connecting terminal 616 also has two legs one of which is bonded to the emitter side conductor pattern 614 on the one of the insulator substrates 106. An anode electrode formed on the top surface of the diode element 607 and the emitter side conductor pattern 614 are connected by a metallic wire 111. Emitter electrode formed on the top surfaces of the IGBT elements 601, 602, 602 and the emitter side conductor pattern 614, gate electrodes formed on the top surfaces of the IGBT elements 601, 602, 603 and the gate resistor element 609 on the gate side conductor pattern 611 are also connected with the metallic wires 111. In FIG. 25, the reference character 115 is casing coupling hole, the reference character 613 is a bolt fixing portion of the collector side terminal, the reference character 617 is a bolt fixing portion of the emitter side connecting terminal, the reference character 619 is a bolt fixing portion of the emitter auxiliary connecting terminal, and the reference character 621 is a bolt fixing portion of the gate side connecting terminal.

Figure 26:
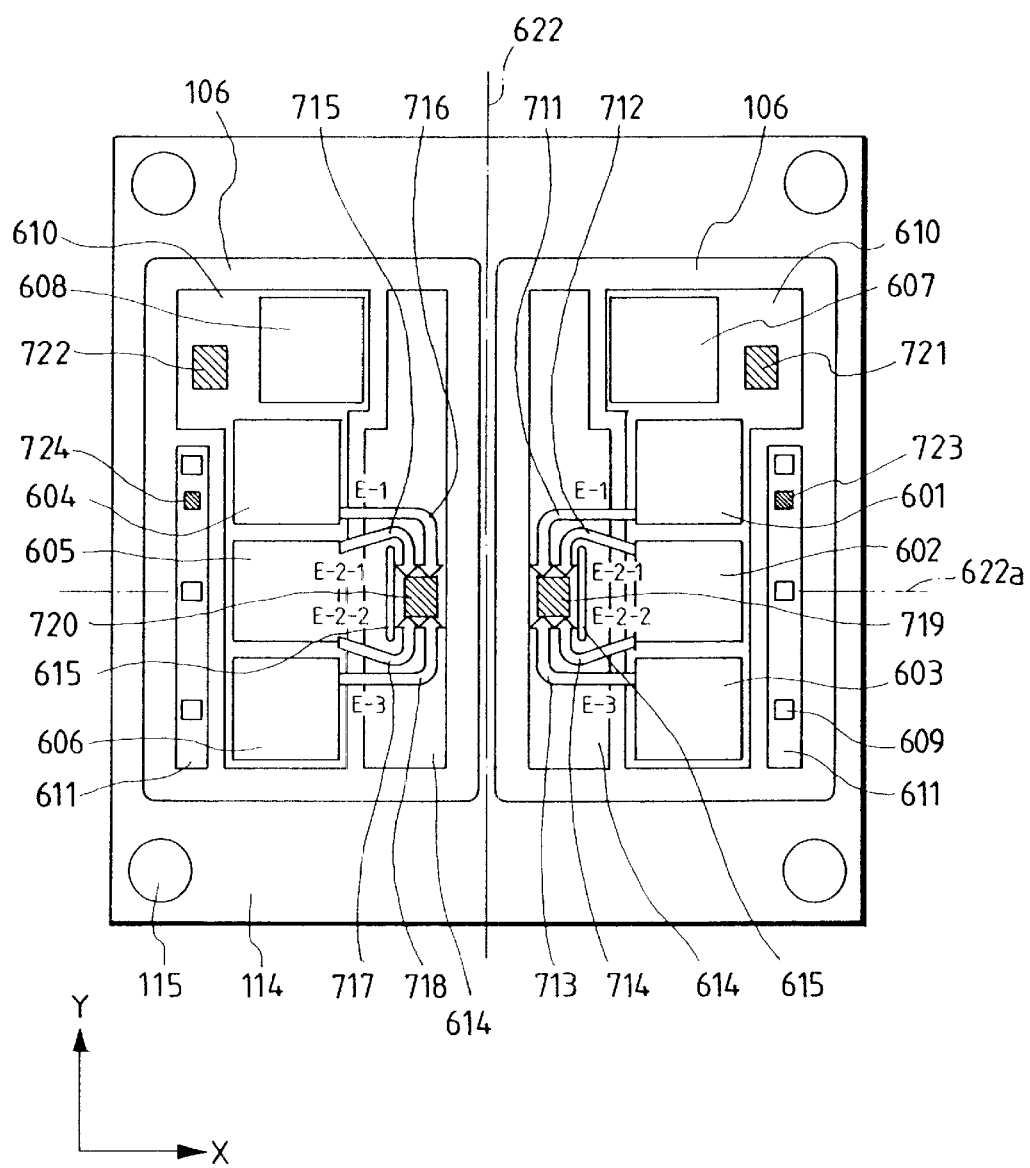
FIG. 26 is an explanatory view showing the shape of conductor pattern and the configuration of diode elements in the second embodiment of the semiconductor module in accordance with the present invention.

As shown in FIG. 26, the shape of each semiconductor element (excluding the portion in relation to the diode element 607), the arrangement of each of the IGBT elements 601, 602, 603, the arrangement of each of the gate resistor element 609, the arrangement of the bonding zone 719 of the emitter side connecting terminal 616 and the like are symmetrical in regard to a specified line (a line parallel to the X direction) 622a on the insulator substrate 106, and the silt 615 is provided. Therefore, the lengths of the current paths 711, 712, 714, 713 between the emitter electrodes of the IGBT elements 601, 602, 603 and the bonding zone 719 of the emitter connecting terminal 616 can be made equal. That is, E31 1=E-2-1=E-2-2=E-3. Here, by forming the slit 615 in regard to the Y direction from a position of the midpoint of the gap between the first IGBT element 601 and the second IGBT element 602 in the Y direction to a position of the midpoint of the gap between the second IGBT element 602 and the third IGBT element 603 in the Y direction, the lengths of the current paths 711, 712, 713, 714 between the emitter electrodes of the IGBT elements 601, 602, 603 and the bonding zone 719 of the emitter side connecting terminal 616 can be made equal.

Although the above is description on one of the insulator substrates 106. In the embodiment, the arrangement and the shape on the other of the insulator substrates 106, the arrangement of each of the elements 604, 605, 606, 608, 609 on the other of the insulator substrates 106, the shapes of the conductor patterns 610, 611, 614, the shape of each of the external connecting terminals 612, 616, 618, 620, the arrangement of the bonding zones 720, 722, 724 of each of the external connecting terminals 612, 616, 618, 620 on the other of the insulator substrates 106 are made symmetrical to one of the insulator substrates 106 and these provided on one of the insulator substrate. Therefore, the same amount of current can be conducted to the elements on one of the insulator substrate 106 and the elements on the other of the insulator substrates 106.

The third embodiment of a semiconductor module according to the present invention will be described below, referring to FIG. 27 and FIG. 28. The different points of this embodiment from the second embodiment are that only two IGBT elements 601, 602 are mounted on one insulator substrate 106, there is no slit on the conductor pattern, and the shape of each of the external connecting terminals and the arrangement of the bonding zone of each of the external connecting terminals are different. The others are basically the same as in the second embodiment. Therefore, the different points from the second embodiment will be described in detail below.

The collector side connecting terminal 612 comprises bonding portions 612a, 612a' bonded to the collector side conductor patterns 610, 610 symmetrical in regard to the center line 622 of the metallic supporting board 114, first rising portions vertically rising from the bonding portions 612a, 612a', first inducing portions extending from the top ends of the first rising portions in the direction away from the center line 622, second rising portions vertically rising from the ends of the first inducing portions, a second inducing portion 612b extending from the top ends of the second rising portions in the direction approaching to the center line 622, a facing portion 612c vertically rising from the middle of the second inducing portion 612b, that is, from a position on the center line 622, and a bolt fixing portion 613 extending from the top end of the facing portion 612c in the +Y direction.

Figure 27:
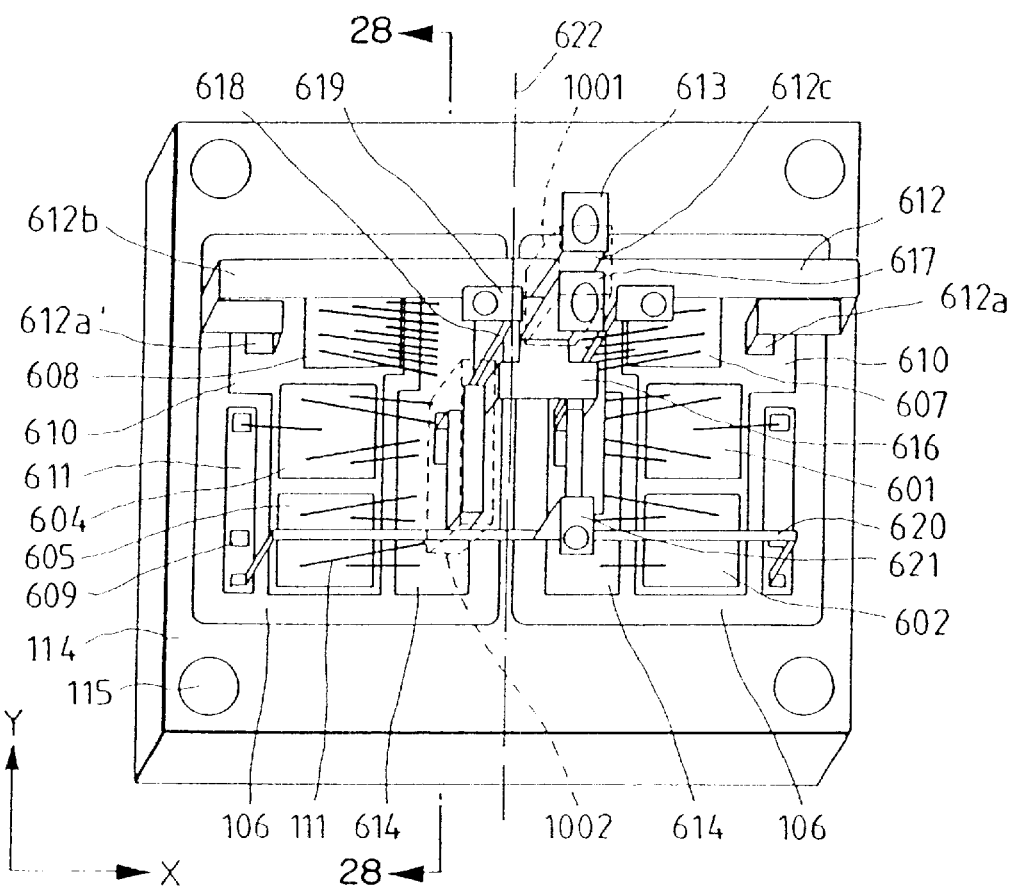
FIG. 27 is a perspective view showing the third embodiment of a semiconductor module in accordance with the present invention.
Figure 28:
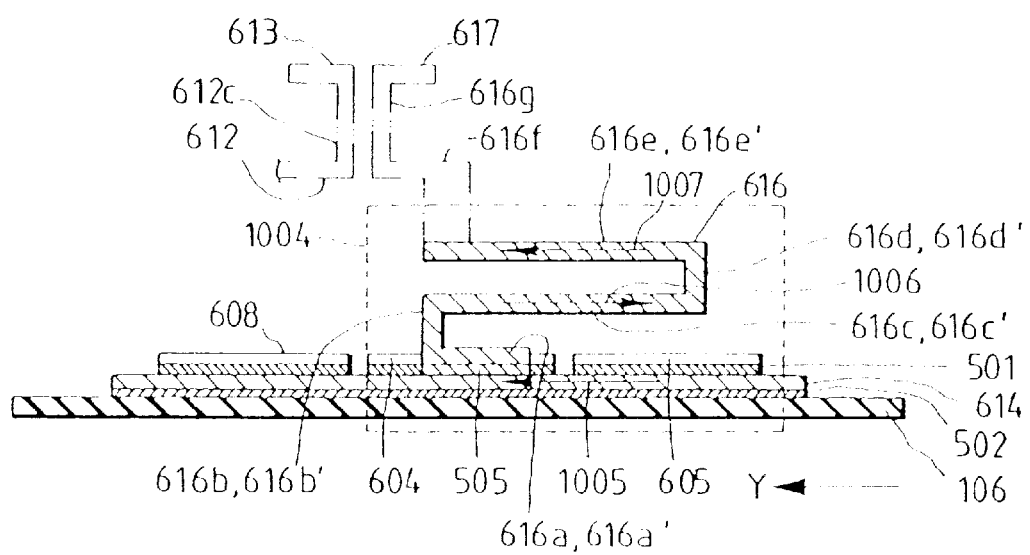
FIG. 28 is a cross-sectional view taking the plane along the line B—B in FIG. 27.

The emitter side connecting terminal 616, as shown in FIG. 27 and FIG. 28, comprises bonding portions 616a, 616a' bonded to emitter side conductor patterns 614, 614 symmetrical in regard to the center line 622 of the metallic supporting board 114 using a solder 505, first rising portions 616b, 616b' vertically rising from the bonding portions 616a, 616a', first inducing portion 616c, 616c' extending from the top dens of the first rising portions 616b, 616b' in the −Y direction, second rising portions 616d, 616d' vertically rising from the −Y side end of the first inducing portions 616c, 616c', second inducing portions 616e, 616e' extending from the top ends of the second rising portion 616d, 616d', a third inducing portion 612f extending from the second inducing portions 616e, 616e' approaching to the center line 622, a facing portion 616g vertically rising from the middle of the third inducing portion 612f, that is, from a position on the center line 622, and a bolt fixing portion 617 extending from the top end of the facing portion 616g in the −Y direction.

The bonding portions 616a, 616a' of the emitter side connecting terminal 616 are bonded to positions on the emitter side conductor patterns 614, 614 and as close to the diode elements 607, 608 as possible. The emitter side connecting terminal 616 serves the diode elements 607, 608 as an anode side connecting terminal. When the bonding portions 616*a*, 616*a'* is close to the diode elements 607, 608, the inductances between the bonding portions 616*a*, 616*a'* and the diode elements 607, 608 can be lessened. As the result, even if the current fluctuation dI/dt during switching operation is large, the current over shoot is small and the noise current due to current oscillation to the gate electrode can be decreased.

The first inducing portions 616*c*, 616*c'* and the second inducing portions 616*e*, 616*e'* of the emitter side connecting terminal 616 are parallel to and facing to the patterns 614, 614. Further, the first inducing portions 616*c*, 616*c'* and the second inducing portions 616*e*, 616*e'* are extended from the position of the IGBT element 604 to the position of the IGBT element 605 in the Y direction. As described above, when currents flow in the opposite direction in parallel wires, the inductance in the parallel wires can be cancelled. In this embodiment, the current 1005 flowing in the emitter side conductor patterns 614, 614 and the current 1007 flowing in the second inducing portions 616*e*, 616*e'* are in the opposite direction to the current 1006 flowing in the first inducing portions 616*c*, 616*c'*. Consequently, the inductances of the first inducing portions 616*c*, 616*c'*, the second inducing portions 616*e*, 616*e'* and the emitter side conductor patterns 614, 614 are cancelled. Therefore, the Y direction component of the difference between the current path from the IGBT element 604 to the bonding portion 616*a'* of the emitter side connection terminal 616 and the current path from the IGBT element 605 to the bonding portion 616*a'* of the emitter side connecting terminal 616 is cancelled. On the other hand, as for the X direction, there is no difference between the current path from the IGBT element 604 to the bonding portion 616*a'* of the emitter side connection terminal 616 and the current path from the IGBT element 605 to the bonding portion 616*a'* of the emitter side connecting terminal 616. Therefore, although there is a difference between the length of the current path from the IGBT element 604 to the bonding portion 616*a'* of the emitter side connection terminal 616 and the length of the current path from the IGBT element 605 to the bonding portion 616*a'* of the emitter side connecting terminal 616, the difference in inductance between both of the current paths can be almost eliminated.

As described above, independently of the symmetry in element and conductor pattern and the number of elements, it can be easily realized to eliminate the difference in inductance of the current path for each element by forming the facing portion facing to the conductive pattern in the external connecting terminal.

The facing portion 616*g* of the emitter side connecting terminal 616 and the facing portion 612*c* of the collector side connecting terminal 612 are facing to and parallel to each other, and the gap is 10 mm. Further, the currents flowing in both of the facing portions are opposite to each other. Therefore, the inductance in this portion is cancelled, and consequently the inductance of the whole module can be decreased.

The emitter side connecting terminal 616 has first inducing portions 616*c*, 616*c'*, second rising portions 616*d*, 616*d'* and a bonded portion 1004 formed by the second inducing portions 616*e*, 616*e'*. Therefore, it is possible to absorb the difference of thermal expansion of the casing (not shown) and the external connecting terminals 612, 616 similar to the first embodiment.

In this embodiment, each of the external connecting terminals is arranged without crossing with the other external connecting terminal inside the module. Therefore, noise during switching operation can be decreased.

In general, the control current (or control voltage) flowing in the gate side connecting terminal 620 is easily affected by noise such as electromagnetic induction from the gate side connecting terminal 620 and the collector side connecting terminal 612. Therefore, in the embodiment of a semiconductor module according to the present invention, the gate side connecting terminal 620 is arranged in the −Y side on the insulator substrate 106, and the collector side connecting terminal 612 and the emitter side connecting terminal 616 are arranged in the +Y side on the insulator substrate 106. By doing so, the gate side connecting terminal 620 is separated from the collector side connecting terminal 612 and the emitter side connecting terminal 616 to prevent the noise from entering the control current.

The fourth embodiment and the fifth embodiment of semiconductor modules according to the present invention will be described below, referring to FIG. 29 and FIG. 30 respectively.

Figure 29:
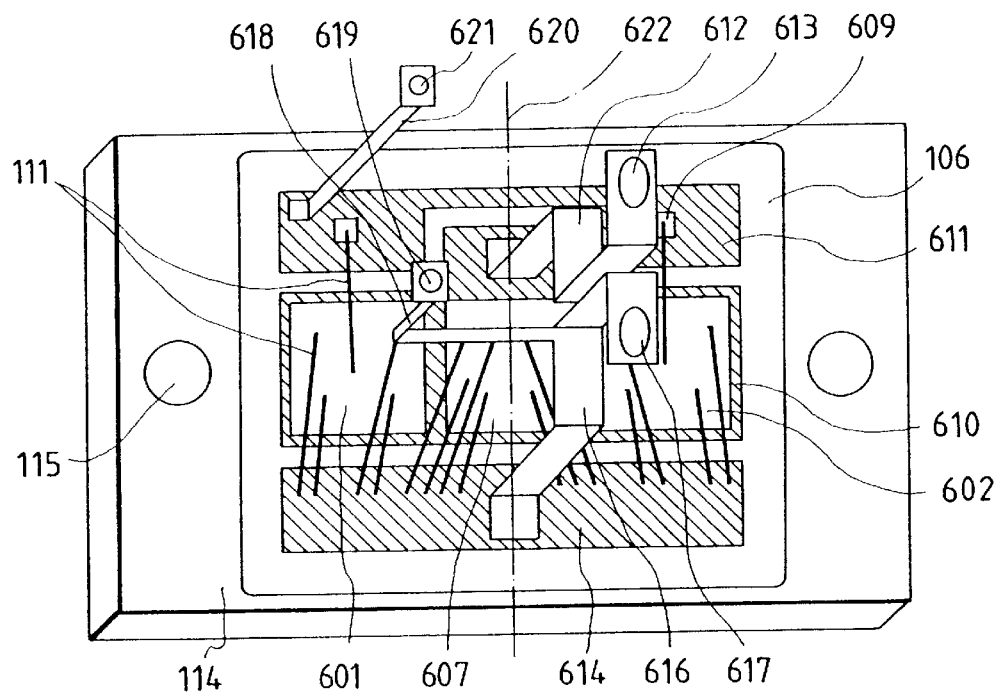
FIG. 29 is a perspective view showing the fourth embodiment of a semiconductor module in accordance with the present invention.

The fourth embodiment of a semiconductor module is an IGBT module mounting two IGBT elements 601, 603 and one diode element 607 as shown in FIG. 29. On a metallic supporting board 114, an insulator substrate 106 is arranged by putting its center on the center line 622. On the insulator substrate 106, a collector side conductor pattern 610, an emitter side conductor pattern 614 and a gate side conductor pattern 611 are formed so that the positions and the shapes are symmetrical in regard to the center line 622. On the collector side conductor pattern 610, the IGBT elements 601, 603 and the diode element 607 are arranged and a collector side connecting terminal 612 is bonded. On the gate side conductor pattern 611, two gate resistor elements 609, 609 are arranged and a gate side terminal 620 is bonded. On the emitter side conductor pattern 614, an emitter side connecting terminal 616 and an emitter auxiliary connecting terminal 618 are bonded. The emitter auxiliary connecting terminal 618 has a leg common to the leg of the emitter side connecting terminal 616 and its bolt fixing portion 619 is formed by branching from the middle of the emitter side connecting terminal 616. The emitter electrodes formed on the top surfaces of the IGBT elements 601, 603 and the emitter side conductor pattern 614, the gate electrodes formed on the top surfaces of the IGBT elements 601, 603, the gate electrodes formed on the top surfaces of the IGBT elements 601, 603 are connected with metallic wires 111 respectively.

In a case where number of bonding positions between the conductor pattern and the external connecting terminals 612, 616, 620 is three as described above, in the assembling process of attaching a terminal block, which is integrated with the external connecting terminals and a casing cover, to the metallic supporting board 114, it is possible that all the external terminals certainly contact to the respective bonding positions even if there are errors in the level of the terminal bonding portions when the external connecting terminals are bonded to the insulator substrate 601 provided on the metallic supporting board 114 using solder. Therefore, contact defect of terminal does not occur. Further, the thickness of solder can be made uniform.

Since the diode element 607 is placed on the center line 622, the distance to the bonding zone of the emitter side connecting terminal (input side connecting terminal) 616 also placed on the center line 622 is shorter than that of the IGBT elements 601, 602. In more detail, the bonding zone of the emitter side connecting terminal 616 is in a position where the current path length from the position to the anode electrode (input electrode) of the diode element 607 is shorter than the current path length from the position to the emitter electrodes (input electrodes) of the IGBT elements 601, 602. Therefore, since the bonding zone of the emitter side connecting terminal 616 is close to the diode element 607, the inductance of the current path from the position to the anode electrode of the diode element 607 becomes small. As the result, as described above, even if the current fluctuation dI/dt during switching operation is large, the current over shoot is small and the noise current due to current oscillation to the gate electrode can be decreased.

Figure 30:
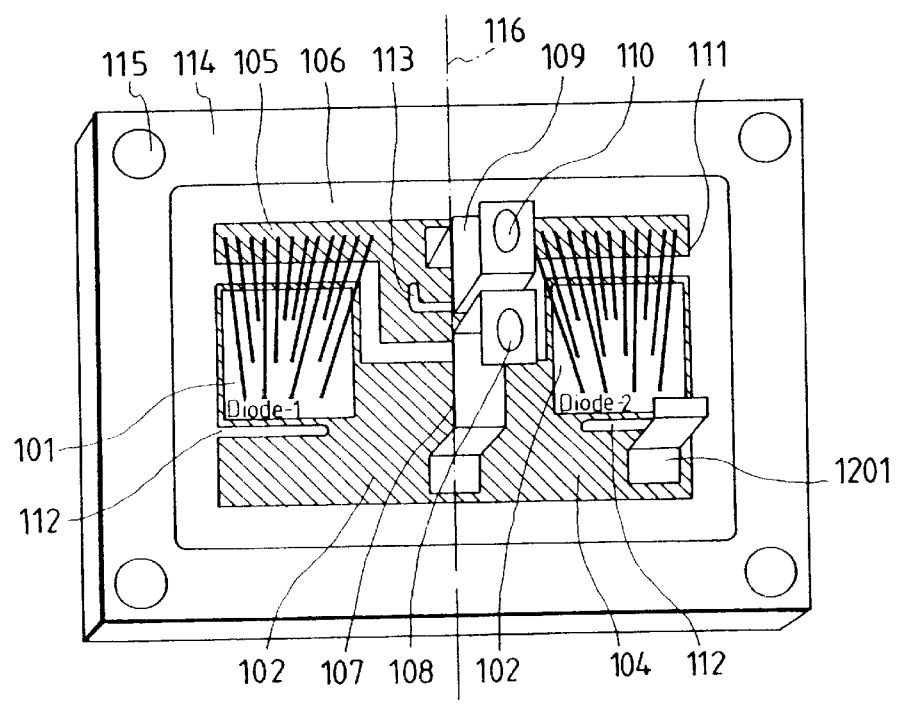
FIG. 30 is a perspective view showing the fifth embodiment of a semiconductor module in accordance with the present invention.

The fifth embodiment of a semiconductor module is a diode module mounting two diode elements 101, 102 as shown in FIG. 30. On a metallic supporting board 114, an insulator substrate 106 is arranged by putting its center on the center line 116. On the insulator substrate 106, a cathode side conductor pattern 104, an anode side conductor pattern 105 so that the positions and the shapes are symmetrical in regard to the center line 116. In the cathode side conductor pattern 104, slits 112, 112 are formed, and two diode elements 101, 102, a cathode side conductor terminal 107 and an auxiliary support column 1201 are bonded. The two diode elements 101, 102 are arranged symmetrically in regard to the center line 116. The two slits 112, 112 are also formed symmetrically in regard to the center line 116. The cathode side connecting terminal is arranged on the center line 116. In the anode side conductor pattern 105, a slit 113 is formed and an anode side connecting terminal is bonded. The slit 113 is formed symmetrically in regard to the center line 116. The anode side connecting terminal 109 is arranged on the center line 116. Anode terminals formed on the top surfaces of the diode elements 101, 102 and the anode side conductor pattern 105 are connected with metallic wires 111.

In a case where there are not three external connecting terminals as this case, by providing the auxiliary column 1201 which does not play any electrical role, the same effect as in the fourth embodiment can be attained.

In the fourth and the fifth embodiments, number of columns (including external connecting terminals) is three. In a case where number of parallel elements in a module is increased in order to increase electrical capacity of module, four or more columns may be provided. However, in this case, it is important to align the level of the columns accurately in its assembling process.

In the above embodiments, IGBT elements and external connecting terminals are arranged symmetrically in regard to a certain phantom line. However, it is acceptable that only most important portions for matching inductance to each IGBT, that is, the emitter side connecting terminal (input side connecting terminal) 616 and the collector side terminal (output side terminal) 612, in which main current flows, are symmetrically arranged, and the gate side connecting terminal (control connecting terminal) 620 and the emitter auxiliary connecting terminal (control connecting terminal) 618 are arranged not symmetrically. Even if the gate side connecting terminal 620 and the emitter auxiliary connecting terminal 618 are arranged not symmetrically, the current flowing in each of the elements does not become unbalance. Therefore, when an inverter or something is produced by combining a plurality of module, it is possible to select a most effective configuration for wiring paths without symmetrical arrangement of the gate side connecting terminal 620 and the emitter auxiliary connecting terminal 618. However, since the gate connecting terminal 620 is apt to be affected by noise due to electromagnetic induction from the main connecting terminal (the emitter side connecting terminal 616 and the collector side connecting terminal 612), it is preferable to arrange the gate connecting terminal away from the main connecting terminal as far as possible.

As for matching of inductance to each of IGBT elements and diode elements, it is not always necessary that the emitter side connecting terminal 616 and the collector side terminal 612, in which main current flows, are symmetrically arranged. By cutting away a part of the conductor pattern and forming a current bypass portion, or by forming a turn back portion in the external connecting terminal, the inductance matching can be obtained. However, even in this case, the symmetry in the shape of the conductor pattern is preferable from the stand point of easiness of design and degree of freedom on layout of semiconductor elements.

The sixth embodiment of a semiconductor module will be described below, referring to FIG. 31 to FIG. 33. In the embodiment, the external connecting terminals are not arranged symmetrically in regard to a certain phantom line.

Figure 31:
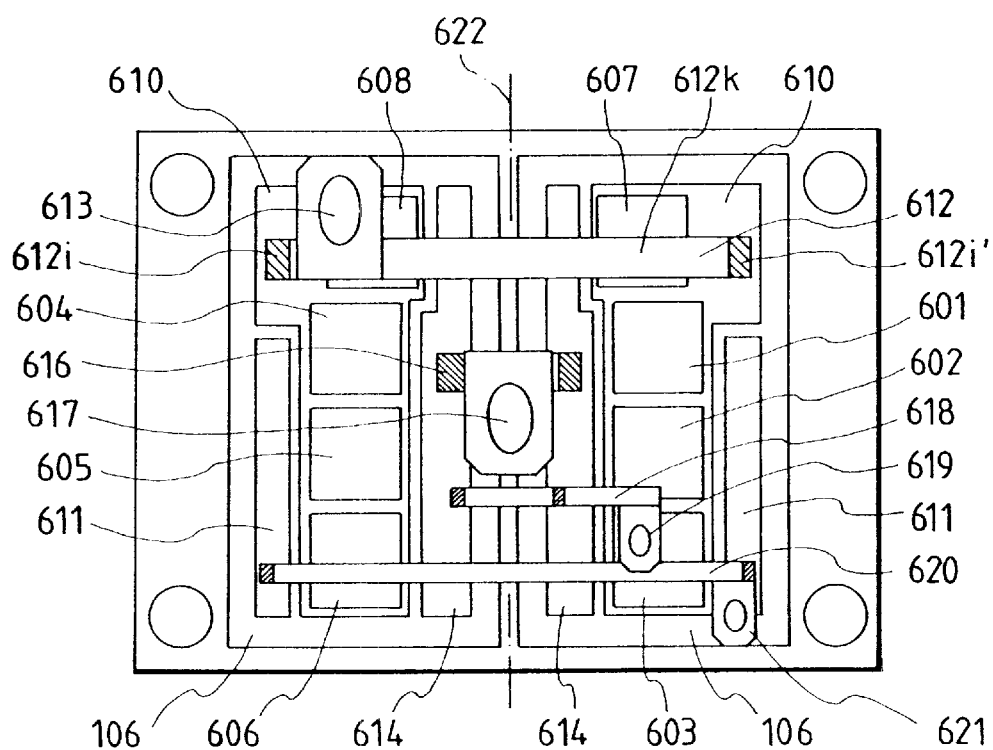
FIG. 31 is a front view showing the sixth embodiment of a semiconductor module in accordance with the present invention.

The semiconductor module in this embodiment comprises two sets of insulator substrates each of which mounts three IGBT elements and one diode element as shown in FIG. 31. On a metallic supporting board 114, two insulator substrates 106, 106 are arranged symmetrically in regard to the center line 622 of the metallic supporting board 114. On one of the insulator substrate 106, conductor patterns 610, 611, 614 are formed. Among the conductor patterns 610, 611, 614, on the collector side conductor pattern 610, the IGBT elements 601, 602, 603 and the diode element 607 are arranged and a collector side connecting terminal 612 is bonded. The collector side connecting terminal 612 has two legs one of which is bonded to the collector side conductor pattern 610 on one of the insulator substrates 106. On the gate side conductor pattern 611, three gate resistor elements 609 (not shown) are arranged and a gate side connecting terminal 620 is bonded. The gate side connecting terminal 620 also has two legs one of which is bonded to the gate side conductor pattern 611 on one of the insulator substrates 106. On the emitter side pattern 614, an emitter side connecting terminal 616 and an emitter auxiliary connecting terminal 618 are bonded. The emitter side connecting terminal 616 also has two legs one of which is bonded to the emitter side conductor pattern 614. An anode electrode formed on the top surface of the diode element 607 and the emitter side conductor pattern 614, a metallic electrode and the gate resistor element (not shown) on the gate side conductor pattern 611 are connected by metallic wires 111 (not shown), respectively.

Among the two insulator substrates 106, 106, the conductor patterns 610, 611, 614 and various elements 604, 605, 606, 608 are arranged on the other substrate 106 symmetrically in regard to those on one insulator substrate 106.

Figure 32:
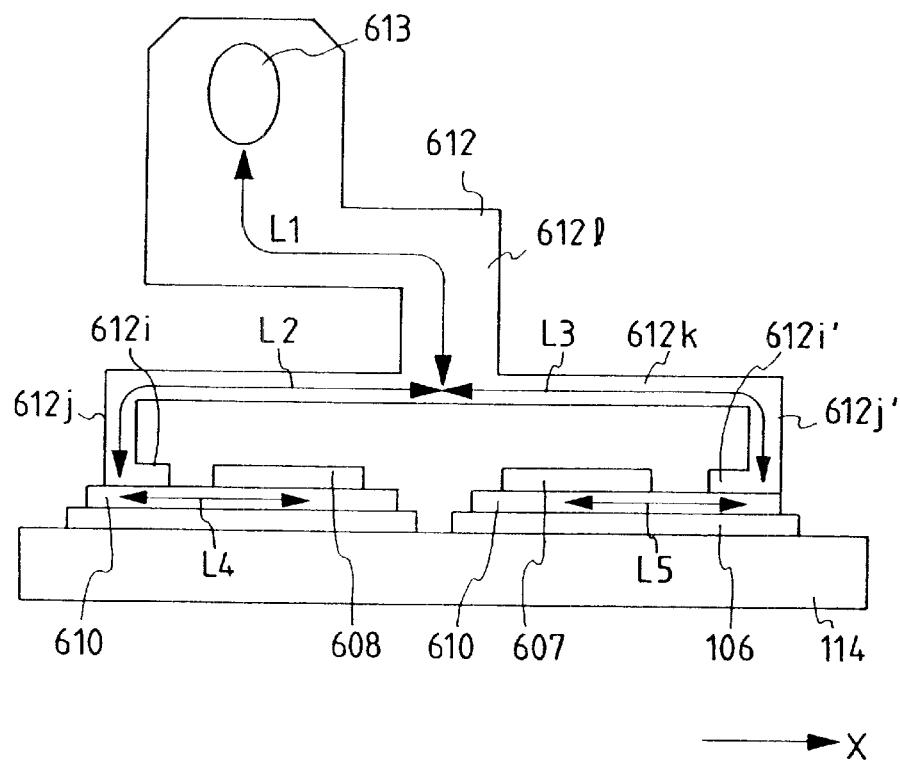
FIG. 32 is a schematic view showing the connecting terminals in the connector side in the sixth embodiment of the semiconductor module in accordance with the present invention.

The collector side connecting pattern 612 comprises, as shown in FIG. 31 and FIG. 32, bonding portions 612i, 612i' bonded to the collector side conductor pattern 610, 610 symmetrical in regard to the center line 622, first rising portions 612j, 612j' vertically rising from the bonding portions 612i, 612i', an inducing portion 612k extending from one of the first rising portion 612j to the other of the first rising portion 612j', a second rising portion 612l vertically rising from the end of the inducing portion 612k, and a bolt fixing portion 613 extending from the top end of the second rising portion 612l in the +Y direction. That is, in the collector side connecting terminal 612, the bonging portions 612i, 612i', although the first rising portions 612j, 612j' and the inducing portion are symmetrical, the second rising portion 612l and the bolt fixing portion 613 are not symmetrical.

Figure 33:
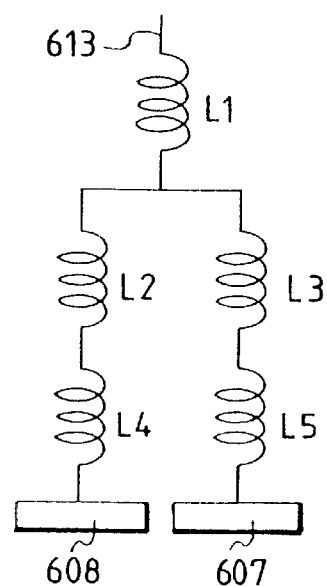
FIG. 33 is a diagram explaining the equivalent circuit of the connecting terminals in the connector side in the sixth

The inductance component from the diode elements 607, 608 to the bolt fixing portion 613 of the collector side connecting terminal 612 is, as shown in FIG. 32 and FIG. 33, composed of an inductance component L5 from the first diode 607 to the first bonding portion 612j' of the collector side connecting terminal 612, an inductance component L4 from the second diode 608 to the second bonding portion 612l of the collector side connecting terminal 612, an inductance component L3 from the first bonding portion 612j' of the collector side connecting terminal 612 to the second rising portion 612l, an inductance component L2 from the second bonding portion 612j of the collector side connecting terminal 612 to the second rising portion 612l, and an inductance component L1 from the second rising portion 612l of the collector side connecting terminal 612 to the bolt fixing portion 613.

In order to keep the inductance matching to each of the diode elements, it is sufficient to satisfy the relation (L3+L5)=(L2+L4) since the component L1 among these inductance components is common to the both diode elements 607, 608. If (L3+L5) in the first diode side is larger than (L2+L4) in the second diode side, a part of the inducing portion 612k is formed to decrease (L3+L5) in the first diode side in such that the part of the inducing portion 612k and the first collector side conductor pattern 610 are arranged to be parallel to and facing to each other. On the contrary, it is also possible that in order to increase (L2+L4) in the second diode side, a part of the pattern 610 between the second diode 608 and the bonding portion 612i is cut away to bypass the current.

Figure 8:
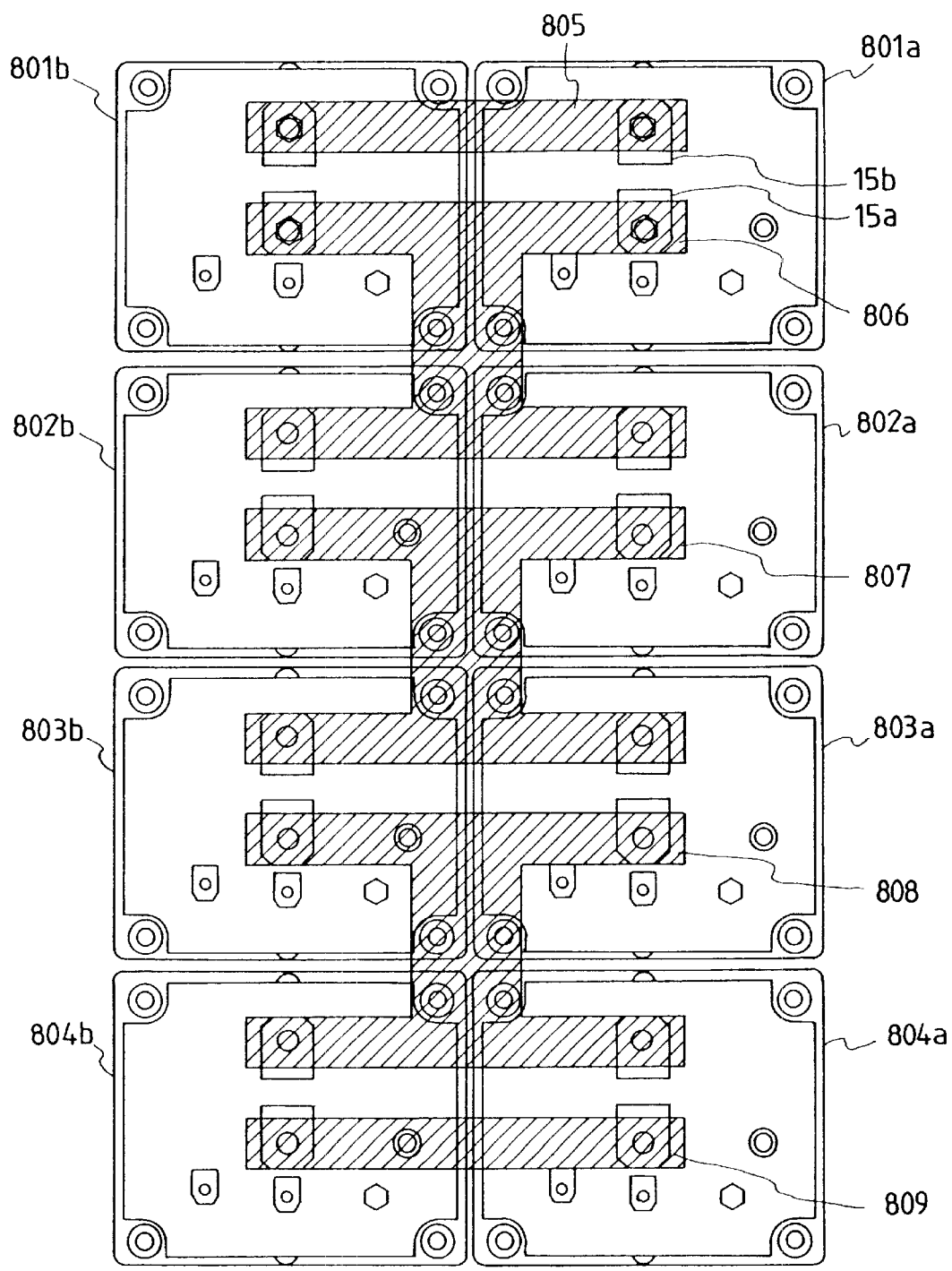
FIG. 8 is a view showing an inverter mounting semiconductor devices in accordance with the present invention.
Figure 9:
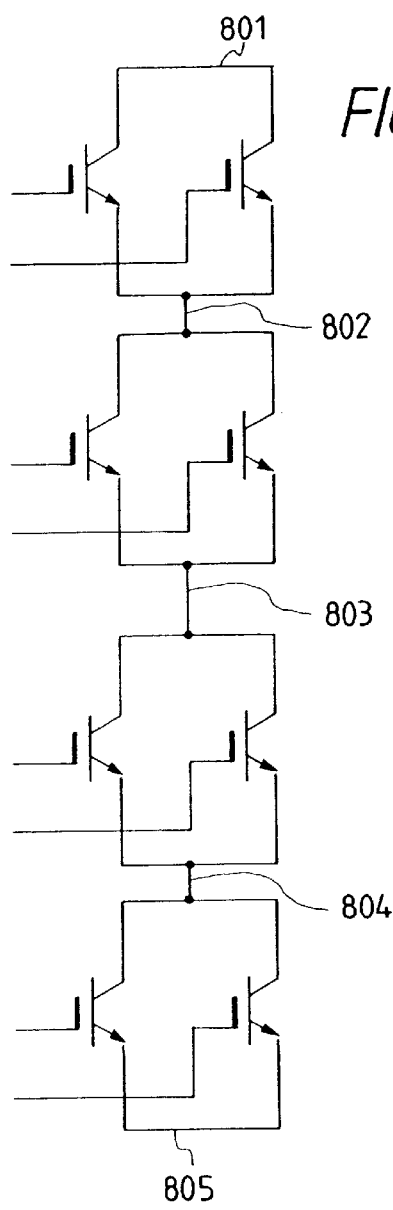
FIG. 9 is an equivalent circuit diagram of the inverter shown in FIG. 8.

Application of a semiconductor device according to the present invention to an inverter will be described below, referring to FIG. 8. A three-level control inverter is taken as an example. FIG. 8 shows a mounting feature of IGBT modules (being regarded as a semiconductor device) for one phase. The Illustration of gate circuit and so on are omitted in the figure. FIG. 9 shows the equivalent circuit (diodes are omitted). In this embodiment, the modules are connected in parallel. The components for three phase are required to form an inverter. One arm is composed of the modules 801a, 801b, 802a, 802b. The reference characters 805 to 809 are bus bars for connecting individual terminals. It can be understood that the inverter is short in vertical length and the modules are connected with simplified bus bars by arranging the modules so that the shorter side of the module directs to the vertical direction and the collector terminals and the emitter terminals are aligned in parallel to the direction of the shorter side.

The main effects of the aforementioned embodiments are as follows.
(1) Since the linear expansion coefficients of chip, ceramic substrate, metallic base are matched, the life time of the solder bonding these materials is substantially improved.
(2) A gate resistor required for parallel operation can be connected so as not to be affected by noise.
(3) Occurrence of crack in gel can be suppressed. The gel crack occurs in a convectional manufacturing process.
(4) Hermeticity inside the device can be improved.
(5) Injection of a hard resin for keeping the hermeticity can be visually and easily controlled.
(6) The device can be fixed without loosing.
(7) The inductance of terminal can be decreased.
(8) Thermal resistance can be decreased and heat generated in a chip can be dissipated.
(9) The weight of device can be decreased.
(10) The mounting area of devices can be decreased and the wiring can be simplified by arranging the collector and the emitter terminals so as to align in the direction of the shorter side of the device.

Figure 10:
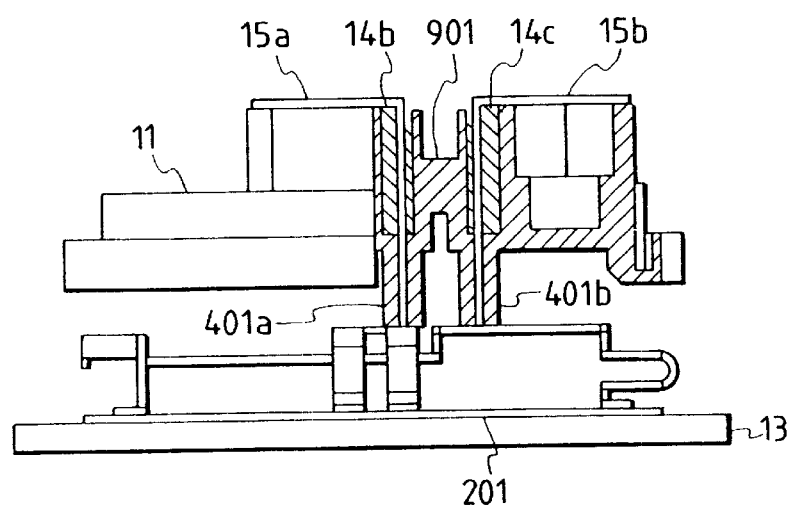
FIG. 10 is a cross-sectional view showing the structure of another embodiment of a semiconductor device in accordance with the present invention.

FIG. 10 shows another embodiment according to the present invention. The reference character 11 is a terminal block, the reference character 13 is a base made of Mo, the reference characters 14b, 14c are hard resin for keeping hermeticity between the terminal and the terminal block, the reference characters 15a, 15b are an emitter terminal and a collector terminal respectively, the reference character 201 is an AlN ceramic substrate, the reference characters 401a, 401b are mold members covering the terminals for keeping the insulation between the terminals, and the reference character 901 is an insulating groove lengthen the surface distance between the terminals. This embodiment has an effect in that the height of the device can be lowered while the inductance of terminal is suppressed small.

Figure 11A:
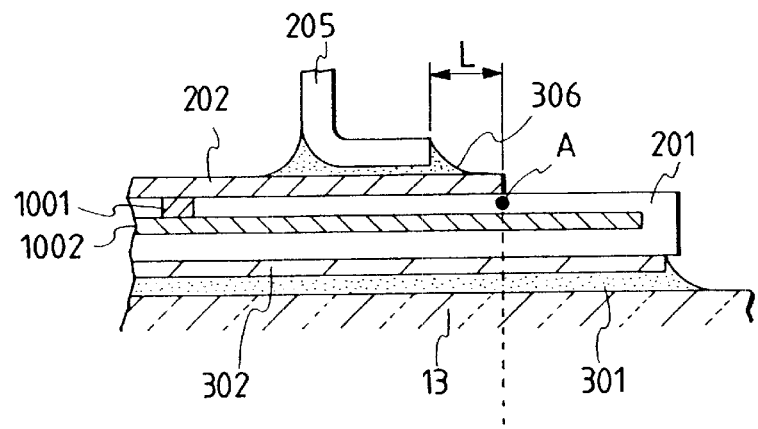
FIG. 11(a) is a view showing another embodiment of a terminal portion, and 11(b) is a graph showing the shear force in the surface of the ceramic substrate under a terminal.

FIG. 11 shows a further embodiment according to the present invention. In FIG. 11(a), the reference character 13 is a metallic base made of Mo, the reference character 201 is a ceramic substrate which is preferably made of a material having a thermal expansion coefficient near that of Si and a large thermal conductivity. AlN ceramic is preferable as described above. Alumina may be employed. The reference characters 202 and 302 are Cu thin plate patterns attached to both surfaces of the ceramic substrate 201, the reference character 301 is a eutectic solder bonding the ceramic substrate 201 and the Mo base 13, and the reference character 1002 is a flat electrode formed inside the ceramic substrate and not exposing its end. The flat electrode may be a solid layer or a mesh. This layer is short-circuited to the collector pattern 202 connected to the collector terminal 205 through a via hole 1001. In this embodiment, a high voltage is applied between the terminal 205 and the base 13. Even if the collector pattern 202 is separated from the AlN ceramic substrate 201, electric field does not applied to the separated portion. Therefore, the partial discharge does not occur.

Figure 11B:
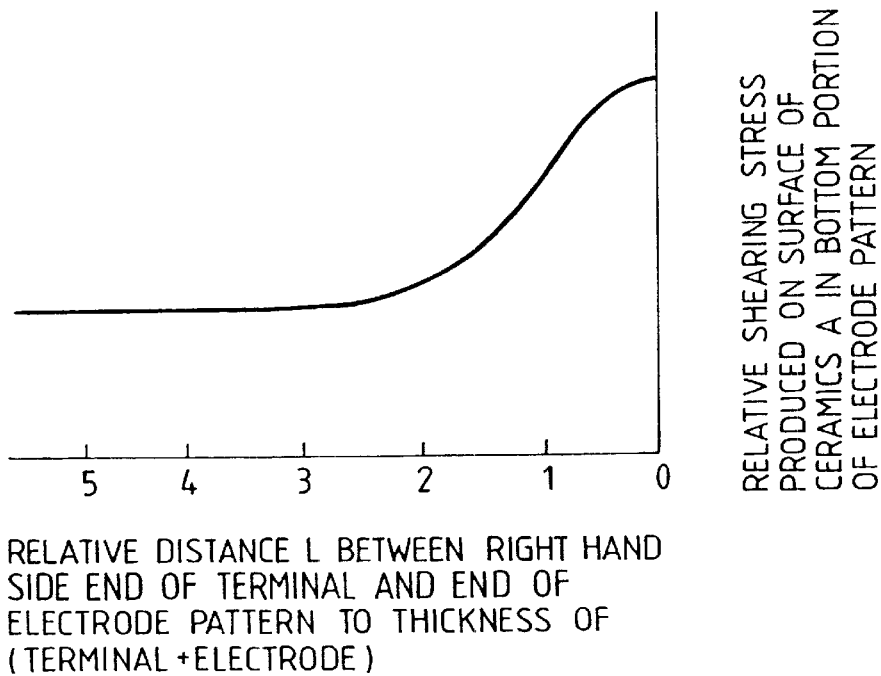

FIG. 11(b) shows change of thermal shear stress on the surface of the ceramic substrate just under the collector pattern 202 when the bonding position of the terminal is changed in FIG. 11(a). The stress is schematically illustrated for the purpose of easy understanding.

Figure 12:
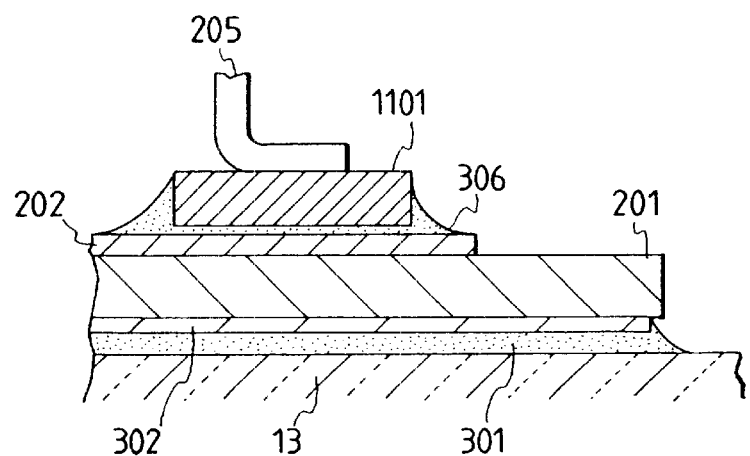
FIG. 12 is a view showing another embodiment of a semiconductor device in accordance with the present invention.

FIG. 12 shows another embodiment according to the present invention. The reference character 13 is a metallic base made of Mo, the reference character 201 is a ceramic substrate which is preferably made of a material having a thermal expansion coefficient near that of Si and a large thermal conductivity. AlN ceramic is preferable as described above. Alumina may be employed. The reference characters 202 and 302 are Cu thin plate patterns attached to both surfaces of the ceramic substrate 201, the reference character 301 is a eutectic solder bonding the ceramic substrate 201 and the Mo base 13, and the reference character 1101 is an intermediate member which is made of a metal having a linear expansion coefficient near that of the ceramic substrate and preferably made of Mo. It is preferable that the collector terminal 205 and the intermediate member 1101 are welded, but may be soldered. The intermediate member 1101 and the AlN ceramic substrate 201 are bonded with a eutectic solder 306 through the collector pattern 202. In this embodiment, since the both side surfaces of the collector pattern 202 are restricted with materials having linear expansion coefficients close to each other, the collector pattern 202 does not separated from the ceramic substrate 201.

Figure 13:
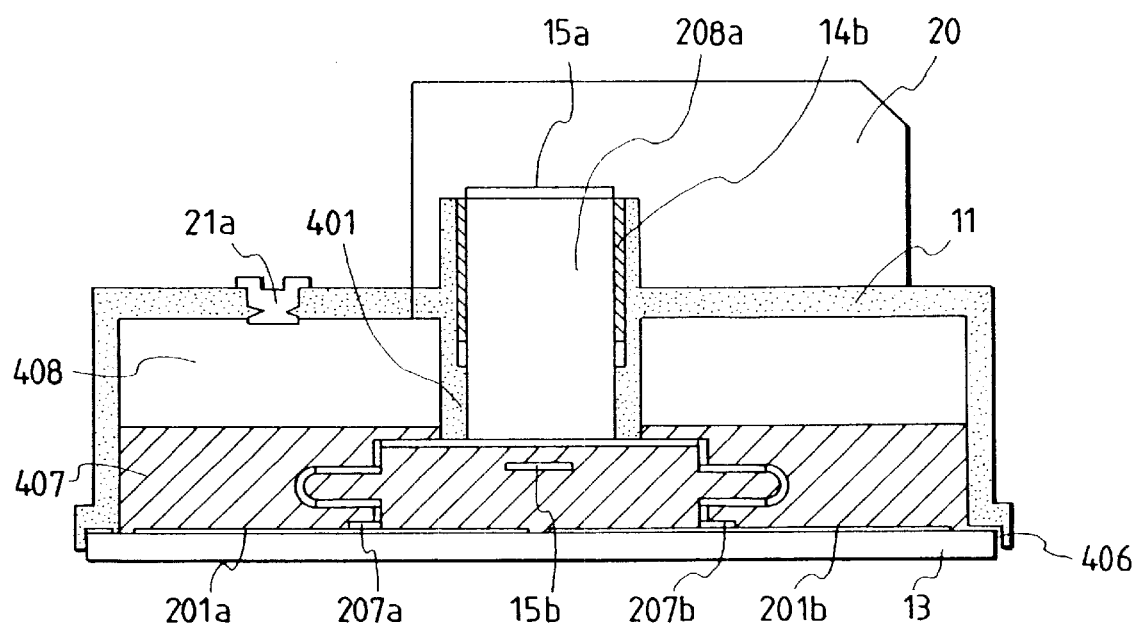
FIG. 13 is a view showing another embodiment of a semiconductor device in accordance with the present invention.

FIG. 13 shows a still further embodiment according to the present invention. This figure is drawn base on FIG. 5. Here, only the different point between the both will be described. In this embodiment, the case 12 (refer FIG. 5) and the terminal block 11 are integrally formed. Therefore, there is no need to hermetically joint the case 12 and the terminal block 11 using a hard resin as shown in FIG. 5.

According to the present invention, it is possible to obtain a small semiconductor device which is long in solder connecting life, small in thermal resistance and hard to cause deterioration in withstanding voltage.

What is claimed is:

1. A semiconductor module mounting a plurality of semiconductor elements of the same kind, which comprises:

a substrate made of an insulator;

said plurality of semiconductor elements arranged on said insulator substrate;

external connecting terminals electrically connected to an external apparatus;

a conductor pattern formed on said insulator substrate, jointed with said external connecting terminals as well as electrically connected with the electrodes of said plurality of semiconductor elements in parallel to form a current path from said external connecting terminals to said plurality of semiconductor elements; wherein said conductor pattern is formed symmetrically in regard to a certain phantom line on said insulator substrate, a plurality of positions on said phantom line and symmetrical in regard to said phantom line being used as jointing zones for said external connecting terminal, current bypass portions to make the individual current paths of said plurality of semiconductor elements in a nearly equal length being provided, the current bypass portion being formed by cutting away a path between a semiconductor element and said jointing zone and providing a bypass for allowing current to flow between the semiconductor element and said jointing zone when the distance between the electrode of the semiconductor element and said jointing zone is shorter than the distances between the electrodes of the other semiconductor elements and said jointing zones (in a case where the semiconductor element has plural electrodes or an expanded electrode the averaged distance being taken as said distance between the electrode of the semiconductor element and said jointing zone.)

2. A semiconductor module according to claim 1, wherein three of said semiconductor elements of the same kind are mounted, one special semiconductor element among said three semiconductor elements being arranged so that the center of weight is placed on said phantom line, the other two semiconductor elements being arranged so that the centers of weight each are placed symmetrically each other in regard to said phantom line and at the corners each in the base of an isosceles triangle having the center of weight of said special semiconductor element as the vertex.

3. A semiconductor module mounting a plurality of semiconductor elements of the same kind, which comprises:

a substrate made of an insulator;

said plurality of semiconductor elements arranged on said insulator substrate;

external connecting terminals electrically connected to an external apparatus;

a conductor pattern formed on said insulator substrate, jointed with said external connecting terminals as well as electrically connected with the electrodes of said plurality of semiconductor elements in parallel to form a current path from said external connecting terminals to said plurality of semiconductor elements; wherein said external connecting terminal comprises a facing portion on said conductor pattern, the facing portion being parallel to and facing to the zone of each of the current paths for each of said semiconductor elements, the direction of current flow in the facing portion being opposite to the direction of current flow in each of the current paths.

4. A semiconductor module according to claim 3, wherein said plurality of semiconductor elements are arranged in a straight line on said substrate, said conductor pattern being formed in the interval from the semiconductor element in one end among said plurality of semiconductor elements arranged in a straight line to the semiconductor element in the other end along said plurality of semiconductor elements, said external connecting terminal being jointed to the portion in the side of said semiconductor element in one end of said conductor pattern, said facing portion extending in the direction arranging said plurality of semiconductor elements from a position corresponding to the position of said semiconductor element in one end to a position corresponding to the position of said semiconductor element in the other end.

5. A semiconductor module according to claim 1, wherein each of said plurality of semiconductor elements individually has an input electrode for allowing current to flow into and an output electrode for allowing current to flow out as said electrodes, an input side connecting terminal for allowing current to flow into from an external apparatus and an output side connecting terminal for allowing current to flow out being provided as said external connecting terminals, an input side conductor pattern jointed with said input side connecting terminal and electrically connected with the input electrodes of said plurality of semiconductor elements in parallel and an output side conductor pattern jointed with said output side connecting terminal and electrically connected with the output electrodes of said plurality of semiconductor elements in parallel being provided as said conductor pattern, said input side connecting terminal and said output side terminal being faced to each other with a space, having parallel input/output facing portions.

6. A semiconductor module according to claim 5, wherein the gap between said input/output facing portions of said input side connecting terminal and said input/output facing portions of said output side connecting terminal is shorter than 10 mm.

7. A semiconductor module according to claim 1, wherein said plurality of semiconductor elements are bipolar transistors, each of the semiconductor element having an input electrode for allowing current to flow into and an output electrode for allowing current to flow out as said electrodes and a control electrode for applying voltage for controlling the quantity of current flowing from said input electrode to said output electrode, an input side connecting terminal for allowing current to flow into from an external apparatus and an output side connecting terminal for allowing current to flow out and a control connecting terminal for applying voltage from an external apparatus being provided as said external connecting terminals, an input side conductor pattern jointed with said input side connecting terminal and electrically connected with the input electrodes of said plurality of semiconductor elements in parallel and an output side conductor pattern jointed with said output side connecting terminal and electrically connected with the output electrodes of said plurality of semiconductor elements in parallel and a control conductor pattern jointed with said control connecting terminal and electrically connected with said control electrodes of said plurality of semiconductor elements in parallel being provided as said conductor pattern, said control connecting terminal being formed and arranged so that the control connecting terminal does not cross with said input side connecting terminal and said output side connecting terminal, and the distance from said control connecting terminal to said input side connecting terminal and said output side connecting terminal is longer than the distance between said input side connecting terminal and said output side connecting terminal.

8. A semiconductor module according to claim 7, wherein a diode element having an input electrode for allowing current to flow into and an output electrode for allowing current to flow out is provided, the input electrode of said diode element being electrically connected with said input side conductor pattern, the output electrode of said diode element being electrically connected with said output side conductor pattern, the jointing zone of said input side connecting terminal on said input side conductor pattern being placed at a position where the length of the current path from said jointing zone to the input electrode of said diode element is shorter than the length of the current path from said jointing zone to said input electrode of said bipolar transistor.

9. A semiconductor module according to claim 1, wherein said external connecting terminal has a bending portion at which the extension of said external connecting terminal in a certain direction turns to the extension of said external connecting terminal in the direction opposite to said certain direction.

10. A semiconductor module according to claim 9, which comprises a metallic wire connecting said conductor pattern and the electrode of said semiconductor element, said bending portion of said external connecting terminal being formed so as not to be placed over/under said metallic wire.

11. A semiconductor module according to claim 1, which comprises a casing for covering said insulator substrate so that a space is formed in the arranging side of said semiconductor element and said conductor pattern on said insulator substrate, silicone gel for filling said space of said casing, said silicone gel filling said space so that an air layer is formed inside said space of said casing.

\* \* \* \* \*